(12) United States Patent
Miyake

(10) Patent No.: US 7,453,560 B2
(45) Date of Patent: Nov. 18, 2008

(54) METHOD OF EVALUATING OPTICAL ELEMENT

(75) Inventor: Akira Miyake, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 393 days.

(21) Appl. No.: 10/933,570

(22) Filed: Sep. 3, 2004

(65) Prior Publication Data

US 2005/0087699 A1 Apr. 28, 2005

(30) Foreign Application Priority Data

Sep. 5, 2003 (JP) ............................ 2003-314842
Feb. 27, 2004 (JP) ............................ 2004-053730

(51) Int. Cl.
*G01N 21/00* (2006.01)
*G01B 9/02* (2006.01)

(52) U.S. Cl. .................... 356/237.2; 356/601; 356/445; 356/521; 250/492.1

(58) Field of Classification Search ............. 356/237.2, 356/491–492, 503–504, 520–521, 511–516, 356/601; 378/70; 355/53, 77
See application file for complete search history.

(56) References Cited

U.S. PATENT DOCUMENTS

| | | | |
|---|---|---|---|
| 5,042,922 A * | 8/1991 | Pepper ....................... 349/17 |
| 6,947,210 B2 | 9/2005 | Terasawa | |
| 6,982,796 B2 * | 1/2006 | Sato ........................... 356/521 |
| 7,016,454 B2 * | 3/2006 | Warnberg ..................... 378/9 |
| 7,022,435 B2 * | 4/2006 | Stearns et al. ................. 430/5 |
| 7,030,998 B2 * | 4/2006 | Takeuchi et al. ............ 356/521 |
| 7,280,184 B2 * | 10/2007 | Hasegawa et al. ............ 355/53 |
| 7,315,380 B2 * | 1/2008 | Chapman et al. ............ 356/450 |
| 2002/0044287 A1 | 4/2002 | Otaki | |
| 2003/0081722 A1 * | 5/2003 | Kandaka et al. ............... 378/70 |
| 2003/0123605 A1 | 7/2003 | Rau | |
| 2003/0142322 A1 | 7/2003 | Sato | |

FOREIGN PATENT DOCUMENTS

| | | |
|---|---|---|
| DE | 101 50 874 | 10/2001 |
| EP | 1 333 260 | 8/2003 |
| EP | 1 335 228 | 8/2003 |
| JP | 2000-055841 | 2/2000 |
| JP | 2000-097620 | 4/2000 |
| JP | 2001-227909 | 8/2001 |
| JP | 2002-243669 | 8/2002 |

(Continued)

OTHER PUBLICATIONS

Nakai, et al. "Stopping Power of Matter for electrons below 10keV" Journal of Applied Physics vol. 51, No. 3, Mar. 1982, pp. 279-285. (English abstract and translation included).

(Continued)

*Primary Examiner*—Sang Nguyen
(74) *Attorney, Agent, or Firm*—Morgan & Finnegan, LLP

(57) ABSTRACT

There is provided an evaluation method of a reflective optical element on which a multilayer film is formed, including the step of calculating a phase difference between light incident upon the multilayer film and light reflected from the multilayer film using a standing wave produced when introducing light with a wavelength of 2 to 40 into the optical element.

13 Claims, 13 Drawing Sheets

FOREIGN PATENT DOCUMENTS

JP          2003-233002          8/2003

OTHER PUBLICATIONS

J.H. Underwood and T.W. Barbee, "Layered Synthetic Microstructures as Bragg diffactors for X- ray and extreme ultraviolet: Theory and Predicted Performance", Applied Optics, vol. 20, No. 17, Sep. 1, 1981. pp. 3027-3034.

Malinowski, et al. Controlling Contamination in Mo/Si Mulitlayer Mirrors by Si Surface- capping Modification. Proc, SPIE vol. 4688 Jul. 2002. pp. 443-453.

European Search Report dated Oct. 28, 2004.

European Patent Office Communication regarding Application No. 04 255 377.6-1226, dated Jan. 10, 2006.

Official letter from European Patent Office dated Dec. 27, 2007, with regard to a corresponding European Application No. 04 255 377.6.

* cited by examiner

METHOD OF EVALUATING OPTICAL ELEMENT

BACKGROUND OF THE INVENTION

The present invention relates generally to evaluations of optical elements, and particularly to a method of evaluating an optical element (e.g., a mirror) on which a multilayer coating is formed using a standing wave, as well as an optical element manufacturing method using such evaluation results and an optical apparatus using the optical element. The present invention is particularly suitable, for example, for evaluation and manufacturing of a multilayer mirror used for a projection exposure apparatus that uses exposure light with a wavelength of 2 to 40 nm to expose various devices such as semiconductor chips (e.g., ICs, LSIs, etc.), display devices (e.g., liquid crystal panels, and the like), sensing devices (e.g., magnetic heads, and the like), and image pickup devices (e.g., CCDs, and the like), as well as adjustments of an optical system having the optical element.

One conventional lithography means for manufacturing fine semiconductor devices such as semiconductor memories, and logic circuits is reduction projection exposure using ultraviolet light. However, the lithography using ultraviolet light has its limit as the semiconductor devices are rapidly becoming more and more fine. In order to efficiently expose so fine of a circuit pattern as less than 50 nm, there has developed an exposure apparatus that uses extreme ultraviolet ("EUV") light with a wavelength shorter than that of the ultraviolet light (hereinafter called "an EUV exposure apparatus"), e.g., a wavelength of more or less 13.5 nm.

The EUV exposure apparatus uses a reflective optical element such as a mirror for its optical system, and forms a multilayer coating, which is made of reciprocally deposited two kinds of materials having different optical constants, on the surface of the reflective optical element. The multilayer coating laminates, e.g., molybdenum (Mo) and silicon (Si), one after the other, on the surface of a glass substrate that is polished to an accurate shape, with a 3 nm-thick Mo layer and a 4 nm-thick Si layer. A combined layer thickness of two kinds of materials is called a coating period. In the above example, the coating period is 7 nm.

Such a multilayer mirror, when receiving the EUV light, efficiently reflects the EUV light with a specific wavelength, i.e., only the EUV light that has a narrow bandwidth centering around and satisfies Bragg's condition. The interference condition is expressed using $\theta$ is an incident angle, $\lambda$ is a wavelength of the EUV light, and d is the coating period. The bandwidth at that time is more or less 0.6 to 1 nm. The interference condition is approximately expressed by, but strictly speaking slightly offset due to influences of refractions in the materials, etc. from, a relational expression of the following Bragg's equation:

$$2 \times d \times \cos\theta = \lambda \tag{1}$$

A surface shape of a projection optical system's reflective surface should be made so precise that it meets, for example, a shape error budget $\sigma$ (rms value) given in the Marechal's criterion, where n is the number of mirrors in a projection optical system, and $\lambda$ is a wavelength of EUV light:

$$\sigma = \lambda/(28 \times \sqrt{n}) \tag{2}$$

For example, $\sigma$=0.19 nm for a six-mirror system with a wavelength of 13 nm. For a pattern transfer with a resolution of 30 nm, wave aberration tolerated to a total projection optical system is more or less 0.4 nm.

A manufacturing method of the projection optical system includes the steps of forming a multilayer mirror, measuring its shape, incorporating it into a barrel, and adjusting the wave aberration.

The multilayer mirror formation step, first, polishes a substrate while repeatedly measuring its shape with an interferometer that uses visible light so as to shape the substrate. Next, a multilayer coating is put onto the substrate surface to arrange an optimal coating thickness distribution with respect to angles and the wavelength of light entering the multilayer coating at various positions within the mirror surface for actual use of the optical system.

The shape measurement step measures the surface shape of the multilayer mirror just having finished the multilayer coating formation once again by an interferometer using the visible light, as well as determining whether the multilayer coating surface satisfies its designated shape (i.e., the above shape error $\sigma$). The multilayer mirror, which is found not to have an intended surface shape, is determined coating failed, and the multilayer coating is stripped off and re-formed.

The mirror barrel incorporation step incorporates into a mirror barrel the multilayer mirrors each determined in the shape measurement step to have the designated surface shape, and adjusts their mutual spacing and tilting, thus completing a projection optical system.

The wave aberration adjustment step adjusts a wave aberration of the projection optical system. If a phase change of light due to its reflection results in a constant value, a wavefront of light reflecting on a mirror can be calculated based on a wavefront of incident light and a mirror shape, but in reality, a phase change of light reflecting on the multilayer mirror differs depending on wavelength, incident angle of light, and coating structure. As a result, the measurements of a geometric surface shape by visible light cannot accurately provide a wavefront of the reflected EUV light. Accordingly, one limitedly implemented method uses the EUV light to directly measure a wavefront of the light reflected on a multilayer mirror or a projection optical system. For example, one known means for directly measuring the wavefront of the light reflective on the multilayer mirror by using the EUV light is a point diffraction interferometer ("PDI") that uses a pinhole to produce a spherical wave (see, for example, Japanese Patent Applications, Publication Nos. 2001-227909 and 2000-97620).

Other prior art includes a method for obtaining information about a layer structure and interface roughness of an X-ray multilayer mirror from a shape of an X-ray standing wave spectrum (see, for example, Japanese Patent Applications, Publication Nos. 2002-243669 and 2000-55841).

Data on electron energy losses in a material is disclosed in "Stopping Power of Matter for Electrons below 10 keV" page 279 of Journal of Applied Physics Vol. 51, No. 3 (March, 1982) by Yohta Nakai, et al. As a relationship between reflectance and phases of reflected light on a multilayer coating, model calculations are disclosed in "Layered Synthetic Microstructures as Bragg's Diffractors for X-Rays and Extreme Ultraviolet: Theory and Predicted Performance" Applied Optics 20, 3027 (1981) by J. H. Underwood and T. W. Barbee. A photoelectric effect of a multilayer coating surface is disclosed in "Controlling contamination in Mo/Si multilayer mirrors by Si surface capping modifications" in pp. 442-453 of Proc. SPIE Vol. 4668 (July, 2002) by Michael E. Malinowski, Chip Steinhaus, W. Miles Clift, Leonard E. Klebanoff, Stanley Mrowka, and Regina Soufli.

However, the PDI method needs an optical system that converges light divergent from one point to another point, and cannot disadvantageously measure a convex surface. In addition, it has a difficulty in measuring even a concave surface when it is an aspheric surface that has a large aspheric volume. Therefore, this method cannot be applied to all the mirrors in the projection optical system, but can only be used for certain measurable mirrors in a limited way.

A relationship of wavefronts between the incident light and the reflected light cannot be actually measured for the remaining mirrors. Therefore, these mirrors can include wavefront aberrations, and a mirror barrel combining those mirrors may not possibly satisfy the intended optical performance. In addition, the PDI method also has a manufacturing problem in that a pinhole used to generate an accurate spherical wave is as small as to the order of several tens of nm. Moreover, a high intensity light source necessary to introduce an ample amount of EUV light into the small pinhole causes a large and expensive measurement system.

Japanese Patent Application, Publication No. 2002-243669 can measure a multilayer mirror's layer shape easily, but cannot obtain a wavefront of the reflected light without considering the phase. An inaccurately obtained wavefront of the reflected light provides the insufficient adjustment of the wavefront aberration, and the insufficient adjustment of the wavefront aberration cannot provide an intended resolution.

Therefore, the present invention has an exemplified object to provide an evaluation method for an optical element that makes it possible to accurately, simply, and inexpensively measure the shape of an optical element having an arbitrary shape that is observed from incident light, and a relationship between incident light and reflected light.

BRIEF SUMMARY OF THE INVENTION

Accordingly, it is an exemplified object of the present invention to provide an evaluation method for an optical element that accurately, easily, and inexpensively measures the shape of an optical element having an arbitrary shape that is observed from incident light, and a relationship between incident light and reflected light.

An evaluation method according to one aspect of the present invention for a reflective optical element on which a multilayer coating is formed includes the steps of measuring a secondary radiation emitted from the multilayer coating when light with a wavelength of 2 to 40 nm is introduced into the optical element, and determining a phase difference of light incident on the multilayer coating and light reflected from the multilayer coating based on a measurement value.

An evaluation method according to another aspect of the present invention of a reflective optical element on which a multilayer coating is formed, said method comprising the steps of applying a resist onto a surface of the multilayer coating, introducing light with a wavelength of 2 to 40 nm into the multilayer coating to which the resist is applied, and exposing the resist, and verifying an exposed result of the exposed.

An evaluation apparatus according to another aspect of the present invention of a reflective optical element on which a multilayer coating is formed includes an illumination optical system for introducing light with a wavelength of 2 to 40 nm into the multilayer coating, a detector for detecting a secondary radiation emitted from the multilayer coating, and an operator part for calculating a phase difference between the light incident upon the multilayer coating and light reflected from the multilayer coating, based on a detection result of said detector.

An exposure apparatus according to another aspect of the present invention includes a catoptric optical system evaluated by the above method, and exposes a pattern on a reticle onto an object.

A device fabrication method as another aspect of the present invention includes the steps of exposing an object using the above exposure apparatus, and developing the exposed object.

DETAILED DESCRIPTION OF THE PREFERRED EMBODIMENTS

Figure 3:
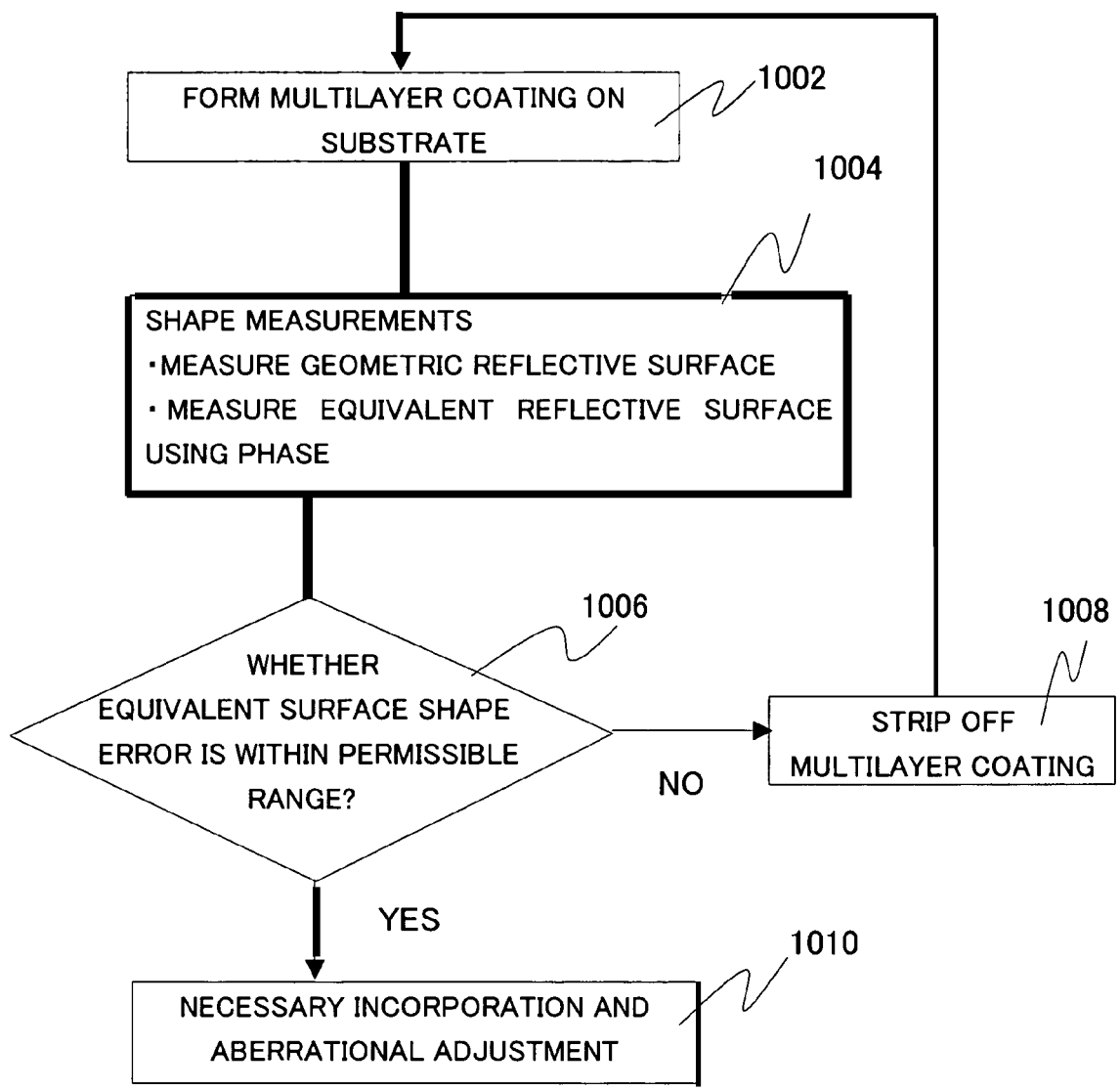
FIG. 3 is a flowchart for explaining a manufacturing method for an optical element according to one embodiment of the present invention.

Referring to FIG. 3, a description will be given of a principal part of a manufacturing method for the reflective optical element of the instant embodiment. Here, FIG. 3 is a flowchart showing a principal part of a manufacturing method 1000 for a reflective optical element of the instant embodiment. First, a multilayer coating having a predetermined coating thickness is formed on a substrate with a predetermined shape (Step 1002).

Next, the surface shape of the multilayer coating is measured (Step 1004). The conventional shape measurement step measures only a geometric surface shape of the multilayer coating. On the other hand, as described below in detail, the instant embodiment calculates an equivalent reflective surface shape based on a phase difference between incident light and reflected light, in addition to the geometric reflective surface shape of the multilayer coating. In calculating the former, the instant embodiment measures a secondary radiation (such as fluorescent X-rays, photoelectrons, etc.) that emits from the multilayer coating through an excitation by a standing wave, formed near the surface of the multilayer coating, when light with a wavelength of 2 to 40 nm (e.g., EUV light and X-ray) enters the multilayer coating formed with a predetermined coating thickness on the reflective optical element (e.g., a multilayer mirror) on a predetermined substrate, and determines, based on the measured value, a phase difference between incident light and reflected light, and obtains the surface shape of "an equivalent reflective surface" by using such a phase difference, as described later. Here, secondary radiation means a radiation produced by an interaction between the radiation directly emitted from a radiation source (or a primary radiation) and a material, and includes fluorescent X-rays, photoelectrons, etc.

Next, it is determined whether or not a difference (or an offset) between a surface shape of "an equivalent reflective surface" and a design value or an ideal shape is within a budget (e.g., the above mentioned shape error a) (Step 1006). If Step 1006 determines that the difference is not within the budget, it considers the multilayer coating was failed, strips off the multilayer coating (Step 1008), and returns to Step 1002. On the other hand, if Step 1006 determines that the difference falls within the budget, it considers the multilayer coating was succeeded, incorporates the optical element into a mirror barrel and the like, and adjusts a wavefront aberration (Step 1010). The instant embodiment enhances the shape measurement accuracy by measuring an equivalent reflective surface shape depending upon the phase difference, and facilitates the subsequent calculations of the wavefront of reflected light and adjustments of the wavefront aberration.

A wavefront of light is defined as a plane having the same phase of electromagnetic vibration and is orthogonal to the geometric-optically expressed light. Wavefronts of parallel rays form a plane orthogonal to a direction in which light travels, and are called a plane wave.

First, for simplicity, suppose that a plane wave with an incident angle of 0° is reflected on a plane mirror. Since the incident angle is 0°, the wavefront is a plane parallel with the mirror surface. When a reflection-induced phase difference on the mirror surface, i.e., a phase difference between reflected light and incident light is constant at every place on the mirror surface, the incident light receives a fixed dose of phase changes in reflection. For this reason, a wavefront of reflected light (which is equal to an equiphase wave surface) is, after all, a plane parallel with the mirror surface.

Next, when a plane wave is reflected on a mirror whose surface is not a plane surface, if a reflection-induced phase difference at the mirror surface is constant at all points on the mirror surface, reflected light undergoes a constant phase change, but an optical-path difference due to an uneven mirror surface offsets a wavefront of the reflecting light (which equals to an equiphase wave surface) from the plane surface. When a certain place on the mirror surface heaves by a, a wavefront of reflected light heaves by 2 h at the corresponding place (away from the mirror surface).

Even when the mirror is a plane mirror, if the phase difference caused by reflection on the mirror surface differs on part of the mirror surface, the reflection light undergoes a phase change that is different depending on the location. Therefore, a shape of a wavefront of reflected light (which is equal to an equiphase wave surface) separates from the plane surface. If a reflection-induced phase difference at a certain location on a plane mirror is bigger by $\delta$ (rad) than surrounding locations, a wavefront of the light reflected at this location has a shape that heaves from the mirror plane by $\delta\lambda/2\pi$ (away from the mirror plane), where $\lambda$ is the wavelength of incident light. While the reflection-induced phase difference at the surface is constant, this case is equivalent to the reflection on a mirror whose mirror surface heaves by $\delta\lambda/4\pi$.

In this way, a mirror shape that is a reflection-induced phase different on a surface converted to a mirror shape is called "an equivalent reflective surface".

Suppose that a plane wave reflects on a mirror on which the surface is not a plane surface and a phase difference caused by reflection is not constant within its plane. When a shape heaves by h at a certain location on a mirror surface and a reflection-induced phase difference at this location is bigger by $\delta$ (rad) than the surrounding locations, the above two cases are superposed: the shape of a reflected light surface becomes a shape that heaves by 2 h+$\delta\lambda/2\pi$ (away from the mirror surface). In this case, the equivalent reflective surface heaves by (h+$\delta\lambda/4\pi$).

Even when the incident angle $\theta$ is not 0°, the same theory similarly applies by correcting a geometric optical-path difference. In general, an equivalent reflective surface may be corrected to h+$\delta\lambda/(4\lambda\cos\theta)$. While the conventional shape measurement step measures only h, the instant embodiment calculates h+$\delta\lambda/(4\pi \cos \theta)$ and compares this with the shape error $\sigma$. While the conventional phase difference $\delta$ could not be correctly measured, the instant embodiment measures the phase difference $\delta$ easily and accurately as described below. The above description addresses an introduction of the plane wave for simplicity. However, even if the incident light is not a plane wave or if it is a spherical wave or an aberration-superposed spherical wave, a sufficiently small area can be approximated with a plane wave and thus the above applies similarly.

When monochrome, parallel EUV light enters a multilayer coating, the EUV light reflected on this multilayer coating causes a phase difference with the incident light. Further, the incident light and reflected light interfere with each other within and outside of the multilayer coating, producing a standing wave. The present invention uses the standing wave to calculate the above phase difference $\delta$, or to correctly measure a relationship between a wavefront of incident light and that of reflected light. This method will be described in detail below:

When EUV light enters and is reflected on the multilayer coating, a phase difference between the incident light and reflected light depends upon multilayer coating structures, optical constants of materials that compose multilayer coating, incident angles, wavelengths of EUV light, and so on. The reflecting light's electric field amplitude is expressed by r×E0, where E0 is the incident EUV light's electric field intensity, and r is an amplitude reflectance. An amplitude E of the electric electric field is given by the following equation where the incident light and reflected light are superposed and a phase difference δ between the incident light and the reflected light:

$$E = E_o((1 + r \times \cos \delta)^2 + (r \times \sin \delta)^2)^{-1/2} \quad (3)$$

Since the electric field intensity is proportionate to the square of the amplitude, and the light reflectance R is the square of an amplitude reflectance r, a ratio I/I0 between the electric field intensity I of the multilayer coating surface (standing wave produced by an interference of incident light and reflected light) and the filed intensity I0 of the incident light can be given by the following equation:

$$I/I_o = (1 + R + 2 \times R^{1/2} \times \cos \delta) \quad (4)$$

Conversely, if the ratio I/I0 between the electric field intensity of the multilayer coating surface and the electric field intensity of the incident light and the reflectance R are obtained from the equation 4, the phase difference δ can be found. The reflectance R can be easily measured by measuring the intensity of the incident light and the reflected light, then computing the ratio of the two. A detailed description is given below of how to measure the ratio I/I0 between the electric field intensity of the multilayer coating surface and that of the incident light.

Figure 4:
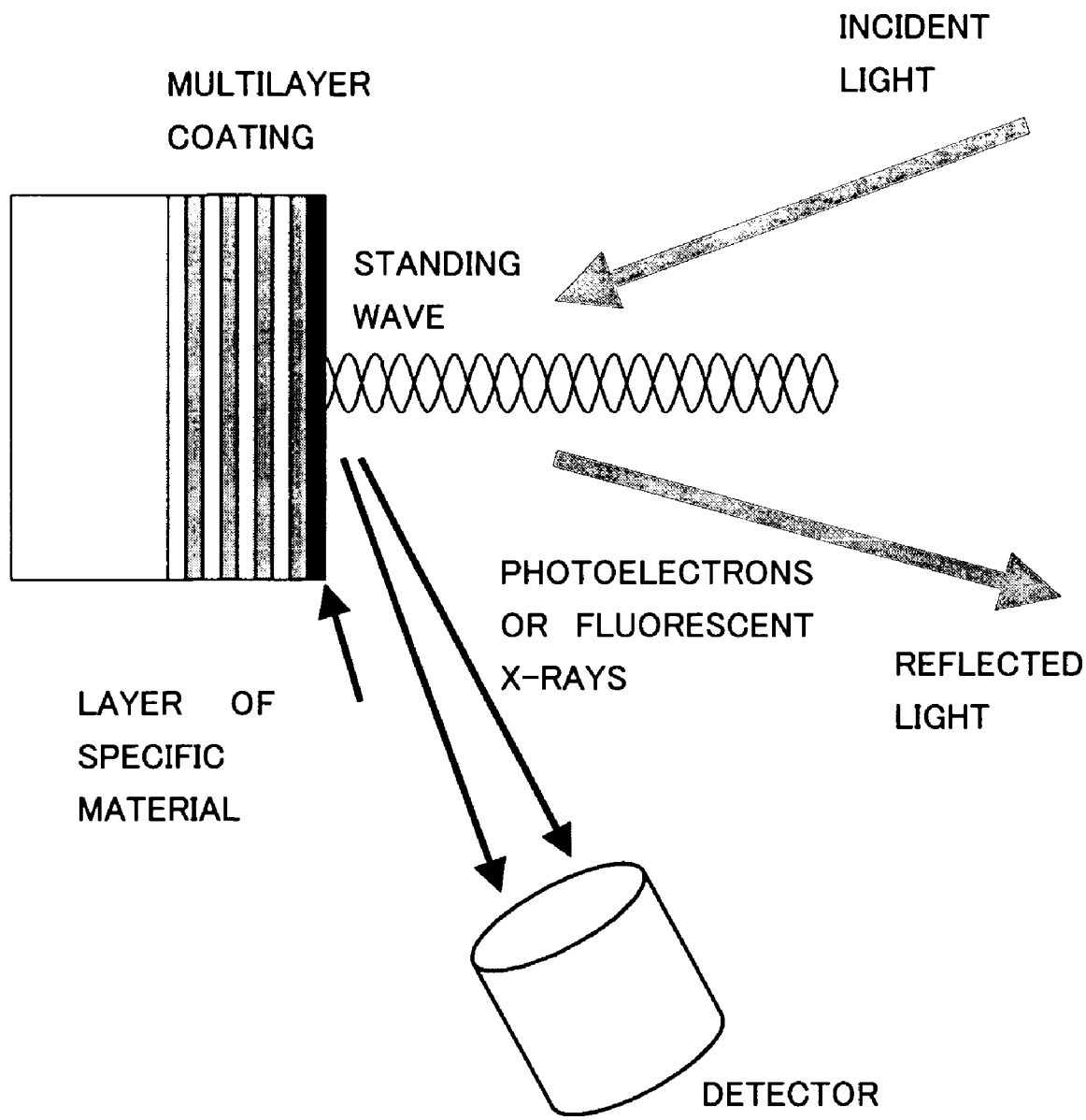
FIG. 4 graphically shows a measurement of a electric field intensity ratio of a multilayer coating surface used in the instant embodiment.

If the EUV light is irradiated to a material under vacuum, the light is partly absorbed by the material, causing a photoelectric effect, which emits electrons. At this time, the dose of photoelectrons emitted is proportional to the electric field intensity at that location. Therefore, as shown in FIG. 4, a photoelectric detector such as a micro channel plate or an electron multiplier tube is installed near an EUV light irradiation area for a multilayer coating to measure the photoelectron dose.

When a photoelectric effect occurs right on the surface of a material, emitted electrons are radiated into the vacuum, scarcely losing energy. This phenomenon is called an external photoelectric effect. On the other hand, when a photoelectric effect occurs inside the material (at a location more than 1 nm deeper than its surface), emitted electrons collide with surrounding atoms and lose energy rapidly, thus rarely coming out into the vacuum. Even if they are emitted into the vacuum, most energy that they had when emitted from the atom is lost, thus being emitted as electrons with low energy. (Refer to "Stopping Power of Material against Electron with 10 keV or below" on page 279 of Applied Physics Vol. 51 No. 3, March of 1982.) Therefore, the dose of electrons emitted into the vacuum through the external photoelectric effect is proportionate to the electric field intensity of an outermost surface of a material (i.e., the inner region with a depth of less than about 1 nm from the surface). When EUV light with an incident angle θ0 satisfying the Bragg's condition and a wavelength λ0 enters a multilayer coating that is structured to provide high reflectance with a predetermined incident angle θ0 and a predetermined wavelength λ0, the dose of photoelectrons QR emitted into the vacuum from the surface is in proportion to the electric field intensity of a standing wave at an outermost surface of a material, which standing wave is caused by interferences of the incident light and reflected light.

If EUV light is irradiated onto a material under vacuum, part of the light is absorbed by the material, and emitted not only as photoelectrons, but also as other secondary radiations, e.g., fluorescent X-rays. The dose of fluorescent X-rays emitted at that time is also proportional to the electric field intensity at that location. An X-ray detector may be used as the detector shown in FIG. 4 to measure the dose of fluorescent X-rays. The dose of fluorescent X-rays may be used as the aforementioned QR.

The fluorescent X-ray has the energy peculiar to the atoms that emit the ray. The electric field intensity at the location of a specific atom can be measured by dispersing the fluorescent X-rays into spectral components and measuring the intensity of X-rays only having specific energy.

Accordingly, a thin film is provided on the outermost surface of a multilayer coating and is made of an element different from the element composing the multilayer coating. If the intensity of fluorescent X-rays peculiar to this element is measured, the electric field intensity near the multilayer coating surface can be measured.

When EUV light with a wavelength of λ enters the multilayer coating at an incident angle that is largely different from the incident angle θ0, the Bragg's equation condition that interference increases the intensity of reflected light is not applicable. Thus, the reflectance becomes very low, and the intensity of the reflecting light becomes smaller than that of the incident light. The dose Q0 of photoelectrons or fluorescent X-rays emitted from the multilayer coating into the vacuum at this time is almost proportionate to the electric field intensity of the incident light. However, if the incident angle is close to 90° at this time, reflectance will become high due to a possible total reflection, and therefore the incident angle should not be close to 90°.

Figure 6:
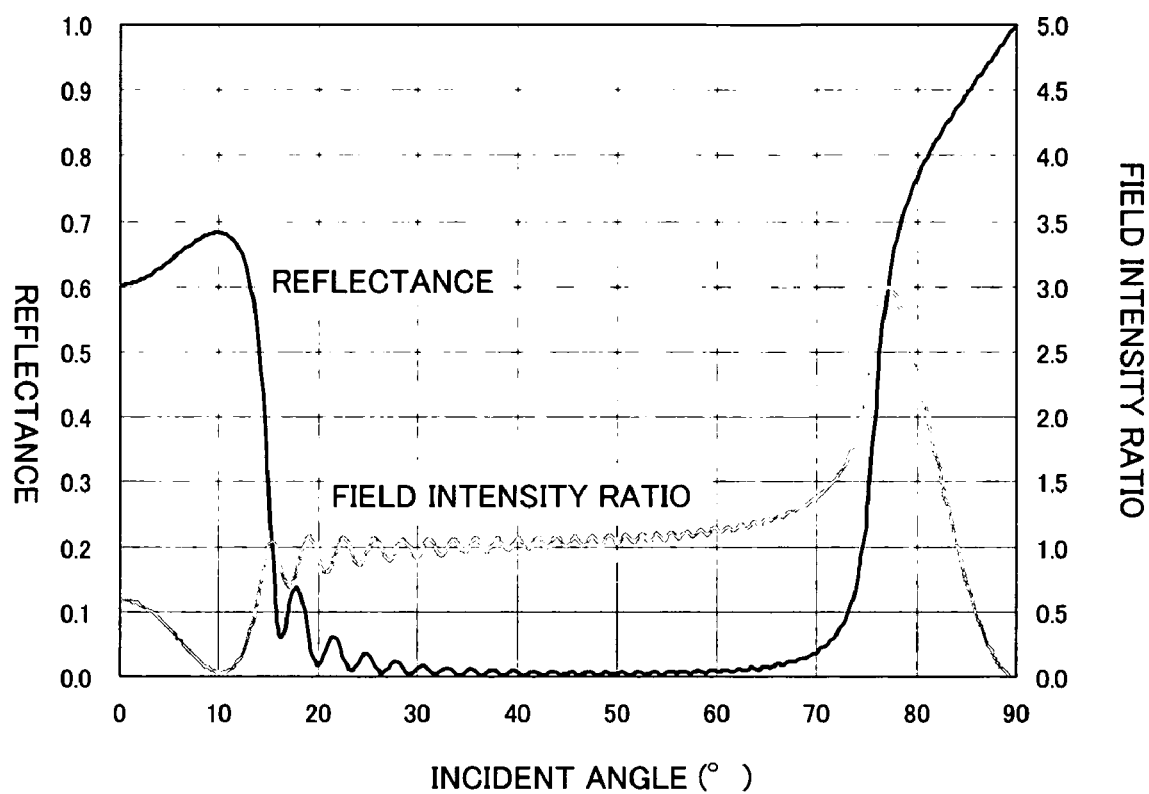
FIG. 6 is a graph for showing exemplary incident-angle dependencies of the reflectance and the electric field intensity ratio.

FIG. 6 is a graph showing an exemplary incident-angle dependency of the reflectance and the electric field intensity ratio. The electric field intensity ratio is a ratio between the electric field intensity of a multilayer coating surface and the electric field intensity of incident light. This example uses a wavelength of 13.5 nm. A multilayer coating is optimized such that reflectance peaks with an incident angle of 10°. In this example, when an incident angle lies roughly in the range of 20° to 700°, the reflectance is less than 1/10 of the peak reflectance (about 70%) at the incident angle of 10°, and the normalized electric field intensity has a value close to 1. In other words, at incident angles roughly in the range of 20° to 70°, the electric field intensity of a multilayer coating is practically equal to that of the incident light. With such an angular range, the dose Q0 of photoelectrons or fluorescent X-rays emitted from the multilayer coating surface into the vacuum at this time is almost proportionate to the electric field intensity of the incident light. Likewise, for a multilayer coating where reflectance is at peak with an incident angle different from the example shown here, largely unlike an incident angle at which reflectance is at peak, a dose Q0 of photoelectrons or fluorescent X-rays emitted from a multilayer coating surface into the vacuum at an angle where reflectance becomes low is almost proportional to the electric field intensity of incident light.

Accordingly, if EUV light enters a multilayer coating with two conditions: at an incident angle that satisfies the Bragg's condition and at which the high reflectance can be obtained, and at an incident angle that does not satisfy the Bragg's condition and at which reflectance becomes very low compared to that, and the quantities QR and Q0 of photoelectrons or fluorescent X-rays emitted into the vacuum are calculated, a ratio between the electric field intensity I (of a standing wave) of a multilayer coating surface and the electric field intensity I0 of incident light can be calculated by the following equation:

$$Q_R/Q_o = I/I_o \quad (5)$$

Figure 1:
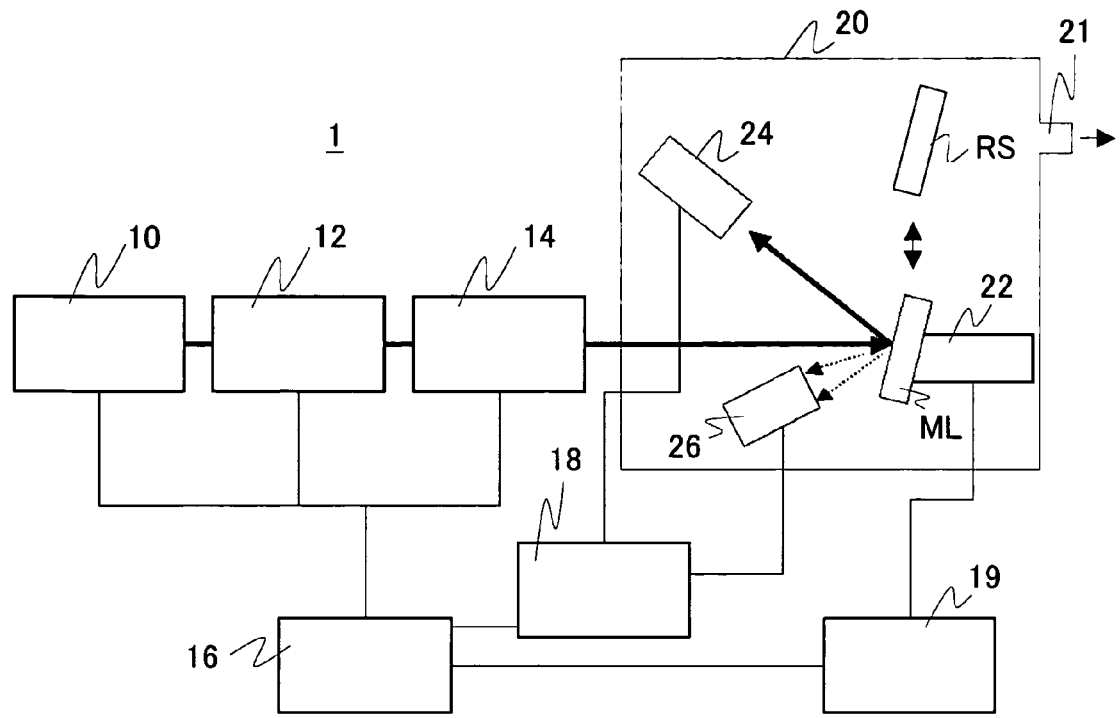
FIG. 1 is a block diagram according to one embodiment of the present invention, which provides a phase change between the incident light upon and reflected light from a multilayer mirror, an equivalent shape change.

If the intensity of incident light may possibly fluctuate under two measurement conditions with different incident angles, a detector can be prepared to measure the intensity of incident light to normalize the dose of electrons emitted by the intensity of the incident light into the vacuum, and control errors accompanying the fluctuations of the incident light intensity. Suppose that the beam intensity measured by a beam intensity monitor (14) is set to I0R, when EUV light with an incident angle of θ0 and a wavelength of λ0 satisfying the Bragg's condition enters a multilayer coating that has been structured so as to provide the high reflectance may be obtained with the predetermined incident angle of θ0 and predetermined wavelength of λ0, and a measuring apparatus shown in FIG. 1 is used to measure the dose of photoelectrons or fluorescent X-rays emitted from the surface into the vacuum.

When EUV light with a wavelength of λ0 and an incident angle largely different from the incident angle of δ0 enters this multilayer coating, the condition that the interference intensityens the intensity of the reflecting light is not applicable. Therefore, the reflectance becomes very low, and the intensity of reflected light becomes smaller than that of incident light. In measuring the dose Q0 of photoelectrons or fluorescent X-rays emitted from the multilayer coating surface into the vacuum at this time, I00 is defined as the beam intensity measured by the beam intensity monitor (14). The dose of photoelectrons or fluorescent X-rays emitted into the vacuum is normalized by the incident light intensity, as in the following equation, so as to reduce the errors accompanying the fluctuations of the incident light intensity:

$$(Q_R \times I_{00})/(Q_0 \times I_{0R}) = I/I_0 \quad (6)$$

When EUV light with a wavelength of λ that offsets from the wavelength of λ0 satisfying the Bragg's condition enters, at an incident angle of θ0, the multilayer coating that meets the Bragg's condition, the condition that the interference amplifies the intensity of the reflecting light is not applicable. Therefore, the reflectance becomes low, and the intensity of the reflected light becomes smaller than the intensity of the incident light. For example, as in an example shown in FIG. 8, the reflectance is less than 1/10 lower than the reflectance at peak, showing very small values in the wavelength range outside the wavelengths of 12.8 to 14 nm.

The dose QL of photoelectrons or fluorescent X-rays emitted from the multilayer coating surface into the vacuum at this time is almost proportionate to the electric field intensity of incident light. However, if the wavelength used at this time and the wavelength λ0 satisfying the Bragg's condition are too different from each other, the emission efficiency of photoelectrons or fluorescent X-rays (the number of photoelectrons or fluorescent X-rays emitted at the unit incident photon number) diminishes. Therefore, it is desirable to use a wavelength not very different from one meeting the Bragg's condition. Concretely, since the emission efficiency dose of photoelectrons or fluorescent X-rays rapidly changes with an absorption edge wavelength of elements as the boundary that composes the surface of a multilayer coating, it is desirable to change a wavelength within the range that does not exceed the absorption edge wavelength of elements composing the surface of the multilayer coating.

Accordingly, by irradiating the EUV light onto the multilayer coating while changing wavelengths, and by calculating the doses QR and QL of photoelectrons or fluorescent X-rays emitted into the vacuum at two wavelengths, i.e., a wavelength that provides the high reflectance, and a wavelength that provides a lower reflectance, a ratio between a multilayer coating surface's electric field intensity I and incident light's electric field intensity I0 can be calculated from the following equation:

$$Q_R/Q_L = I/I_0 \quad (7)$$

Similar to measurements at different angles, when the intensity of incident light may possibly fluctuate under two conditions of different wavelengths, a detector can be prepared to measure the incident light intensity to normalize a dose of photoelectrons or fluorescent X-rays emitted into the vacuum, and control errors accompanying the fluctuations of the incident light intensity.

When EUV light enters a single layer coating that is made of the same material and forms the outermost surface of a multilayer coating, the reflectance becomes low, and the intensity of reflected light becomes smaller than that of incident light. The dose Q00 of photoelectrons or fluorescent X-rays emitted from the single layer coating surface to the vacuum at this time is almost proportionate to the electric field intensity of the incident light. Therefore, by calculating the dose QR of photoelectrons or fluorescent X-rays emitted into the vacuum when EUV light enters a multilayer coating at an incident angle that provides the high reflectance, and the dose Q00 of photoelectrons or fluorescent X-rays emitted into the vacuum when EUV light is irradiated to a single layer coating that is made of the same material and that forms the outermost surface of a multilayer coating, the ratio between the electric field intensity I of the multilayer coating surface and the electric field intensity I0 of the incident light can be calculated from the following equation:

$$Q_R/Q_{00} = I/I_0 \quad (8)$$

Even in this case, if an intensity of incident light possibly fluctuates between the two measurements, a detector can be prepared that measures incident light intensity to normalize the dose of photoelectrons or fluorescent X-rays emitted into the vacuum, and control errors accompanying the fluctuations of incident light intensity.

Next, a phase difference δ is calculated using the following equation:

$$\cos\delta = (I/I_0 - 1 - R)/(2 \times R^{1/2}) \quad (9)$$

In calculating a phase difference from a cosine of the phase difference, phase differences should be continuously connected in a continuously measured region or for the wavelength change, although the phase difference has ambiguities of an integral multiple of 2π. In addition, the phase should have a positive inclination near the peak reflectance, although the phase difference has positive and negative ambiguities.

A phase difference of incident light and reflected light δ can be obtained by using the method previously mentioned to measure a ratio I/I0 between the electric field intensity of a multilayer coating surface and the electric field intensity of incident light and reflectance R. A description will now be given of how to find a wavefront of EUV light reflected on a multilayer coating.

A surface shape (i.e., above mentioned h) of the multilayer coating can be precisely measured by using a method known in the art, such as a method that directly measures a shape mechanically by contacting a stylus (or probe) on the surface, and a method using an interferometer using visible light or ultraviolet light.

If a phase difference δ between the incident light and reflected light during reflection on a mirror surface is constant on a mirror surface and does not depend upon incident angles, a common ray tracing and diffractive integral calculus provide a wavefront of EUV light reflected on a multilayer coating (see, for example, Applied Optics I published in July 1990 by Tadao Tsuruta.)

If a phase difference δ between the incident light and the reflected light during reflection on a mirror surface changes inside the mirror surface, or depends on the incident angle, a diffractive integral calculus, etc. that assumes that an optical path length extends on the multilayer coating surface by $\delta\lambda/2\pi$ will provide a wavefront of EUV light reflecting on a multilayer coating from the multilayer coating shape.

Figure 7:
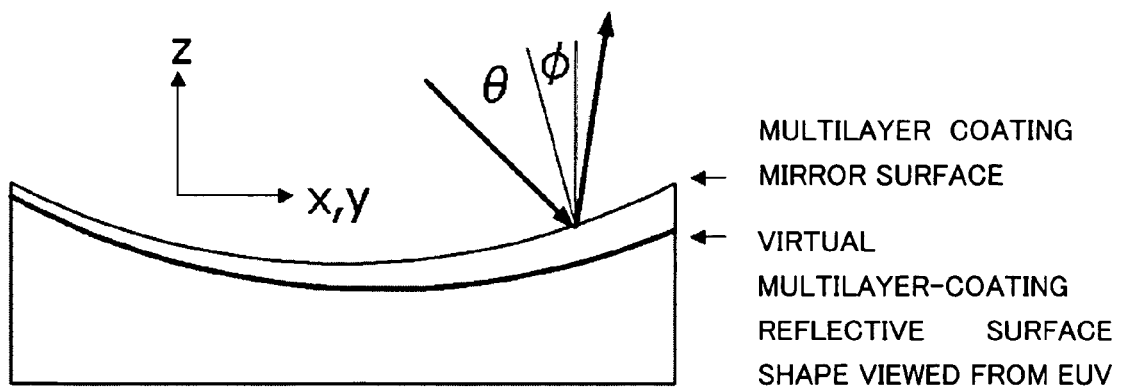
FIG. 7 is a schematic sectional view for explaining a measurement method of the reflecting surface shape of a multilayer mirror.

Alternatively, as shown in FIG. 7, an equivalent surface shape of the multilayer coating viewed from the EUV light is expressed by the equation below, where x and y are coordinates on the mirror surface, h(x, y) is a geometric surface shape of a multilayer mirror, φ(x, y) is an inclination of a mirror normal to the XY plane, θ(x, y) is EUV light's incident angle distribution on the mirror surface, and δ(x, y, λ, θ) is a phase difference between incident EUV light and reflected EUV light. This equivalent surface shape may be used to find the wavefront of reflected light or the ray of reflected light through ray tracing. Here, FIG. 7 is a schematic view for explaining how to measure the reflective surface shape of a multilayer mirror.

$$Z(x, y, \theta) = h(x, y) + \frac{\lambda \delta(x, y, \lambda, \theta)}{4\pi \cos\theta(x, y)\cos\phi(x, y)} \qquad (10)$$

Thus, the instant embodiment uses a standing wave produced when EUV light enters the multilayer coating, to obtain a phase difference δ between the incident light and the reflected light, and calculates, from a measurement result (i.e., h) of the multilayer coating surface's geometric shape and a phase difference δ, $h+\delta\lambda/(4\pi\cos\theta)$ as an equivalent reflective surface shape viewed from the EUV light, or a wavefront of EUV light reflected on the multilayer coating. The conventional shape measurement calculates only h, whereas the shape measurement of the instant embodiment calculates $h+\delta\lambda/(4\pi\cos\theta)$, thus improving the precision of the shape measurement from the perspective of EUV light. As a result, the instant embodiment facilitates subsequent adjustments of the wavefront aberration. In addition, the instant embodiment easily calculate a phase difference between incident light and reflected light using a measuring apparatus, which is simply a usual reflectance measurement device to which a photoelectron or fluorescent X-ray detector is added, providing precise measurements using a very small-scale device compared with conventional interference measurements such as PDI, etc.

These principles may be applied for various patterns. Examples of them will be made clear by the following preferred embodiments.

First Embodiment

FIG. 1 is a schematic block diagram of a measuring apparatus 1 according to the instant embodiment. For the EUV light emitted from an EUV light source 10 such as a synchrotron radiation light source, a laser plasma light source, and a discharge plasma light source, only a predetermined wavelength is extracted by a monochromator 12, and is monochromated. A monochromated EUV beam is led into a measuring chamber 20 in which a multilayer mirror (or a sample) ML as an example of an object to be measured and detectors 24 and 26 are set. The spectrometer 12 and incident-light monitor 14 constitute an illumination system.

The measuring chamber 20 is exhausted up to the ultra-high vacuum region by an exhausting means 21, such a vacuum pump, in order to prevent the air from attenuating the EUV light, from scattering photoelectrons, and from contaminating the multilayer coating surface. The multilayer mirror ML as an example of an object to be measured is fixed onto a rotary and translatable stage 22 so that the monochromated EUV beam may enter the multilayer mirror ML's predetermined position at a predetermined angle. The EUV beam reflected by the multilayer mirror ML is led to the EUV light detector 24 to measure the intensity of the reflected light. The detector 24 can use a photodiode, photoelectron multiplier tube, a CCD, and the like. The beam intensity of the incident light is measured by using the stage 22 to retract the multilayer mirror and directly irradiate the monochromated EUV light to the detector 24. An output from the detector 24 is converted to a voltage signal by using a charge sensitive amplifier, digitized by an analog-digital converter (ADC) 18, and then taken by an arithmetic section 16 of a computer, etc. The arithmetic section 16 calculates a ratio between a beam intensity of the light reflected on the multilayer mirror ML and the beam intensity of the incident light, and obtains the reflectance R.

In order to correct the time variance of light intensity emitted from the light source 10, the incident light monitor 14 measures the intensity of the monochromated EUV light led to the measuring chamber 20. When a synchrotron radiation light source is used, the incident light is monitored by measuring the current in an electron storage ring as a light source.

The detector 26 is installed near the multilayer mirror ML for detecting photoelectrons. An electron multiplier tube, micro channel plate (MCP), etc. may be used for the detector 26. For efficient captures of the emitted photoelectrons, an incident electrode of the detector 26 is set to a positive potential relative to the multilayer mirror ML. If the photoelectrons emitted from the surface of the multilayer mirror ML enter the electron multiplier tube and MCP, they undergo an electron multiplication because of high voltage applied internally. This is converted into a voltage signal using a charge sensitive amplifier, digitalized by an analog-digital converter (ADC), and then introduced to the arithmetic section 16.

The instant embodiment measures a phase of the reflected light using the following steps:

First, the stage 22 retreats the sample ML, and the detector 24 measures the intensity of incident light. The wavelength dependency of the incident light's intensity is measured through the wavelength scanning, i.e., by changing the wavelengths λ of the EUV light exiting from the monochromator 12. The intensity of the incident light is defined as $I_{R0}(\lambda)$, and an output of the incident light intensity monitor at the measurement time is defined as $I_{00}(\lambda)$.

Next, the stage 22 is set so that the monochromated EUV beam enters a predetermined position at a predetermined angle on the multilayer mirror ML, and the detector measures the intensity of incident light. At the same time, the detector 26 measures the dose of photoelectrons emitted from the surface of the sample. Then, the wavelength dependencies of the reflecting light's intensity and the dose of photoelectrons emitted from the surface of the sample ML are measured through the wavelength scanning, i.e., by changing the wavelength settings of the monochromator 12. The intensity of light reflected at the multilayer coating sample is defined as $I_{R1}(\lambda)$. The measured photoelectron emission dose from the multilayer coating sample is defined as $Q_s(\lambda)$. The output of the incident light intensity monitor at the time of the measurement is defined as $I_{01}(\lambda)$.

Next follows a measurement of a dose of photoelectron emissions of a single layer coating mirror made of a material that makes of the top layer of the multilayer coating as reference sample RS. It is desirable that the single layer coating of the reference sample (or the single layer coating mirror) RS be well thicker than the escape depth of a photoelectron, and the transmittance of light to be measured be small. If a wavelength of light is about 13.5 nm, the thickness may be more than several hundred nm for Mo and Si or ruthenium (Ru). A Si wafer may be used for a Si top layer of the multilayer coating.

Measured similar to the multilayer coating sample ML is the wavelength dependency of the dose of photoelectrons emitted from the sample surface of the reference sample RS. While the electric field on the sample surface is a sum of the electric field of the incident light and that of reflected light, the electric field intensity on the single layer coating surface is almost equal to that of the incident light because the reflectance to the EUV light of the single layer coating mirror RS is very low. The wavelength dependency of the measured dose of photoelectron emissions from the reference sample is defined $Q_R(\lambda)$, and an output of the incident light intensity monitor at this time is defined as $I_{02}(\lambda)$.

The wavelength dependency $R(\lambda)$ of reflectance of the multilayer mirror ML is given by the following equation:

$$R(\lambda)=(I_{R1}(\lambda) \times I_{00}(\lambda))/(I_{R0}(\lambda) \times I_{01}(\lambda)) \quad (11)$$

The wavelength dependency $F(\lambda)$ of a ratio between the photoelectron emission dose from the multilayer mirror ML and the photoelectron emission dose from the reference sample RS is given by the following equation:

$$F(\lambda)=(Q_s(\lambda) \times I_{02}(\lambda))/(Q_R(\lambda) \times I_{01}(\lambda)) \quad (12)$$

Figure 8:
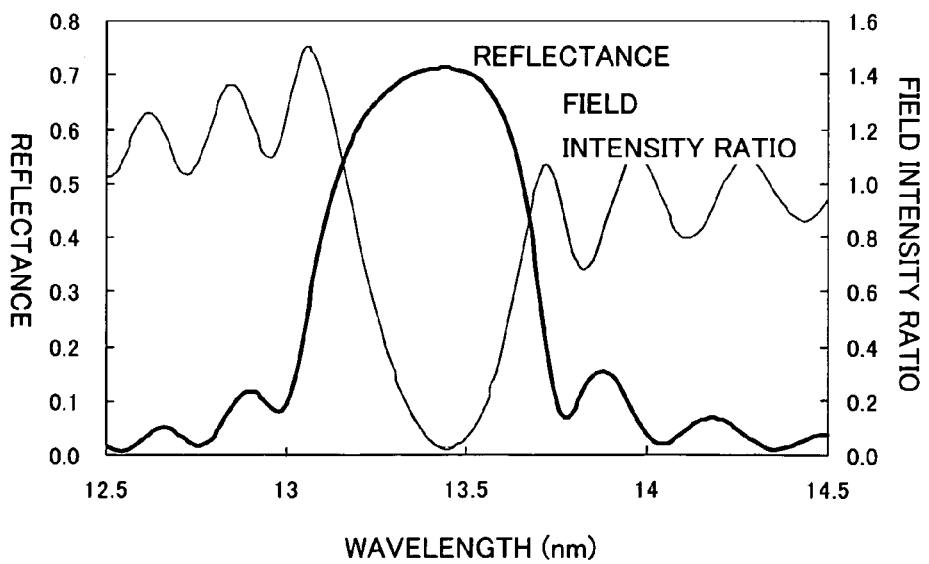
FIG. 8 is a graph showing exemplary measurement results of wavelength dependencies of the reflectance and the electric field intensity ratio obtained in a first embodiment.

$F(\lambda)$ is a parameter showing how many times larger the photoelectron emission dose from the multilayer mirror ML is compared to the single layer coating mirror RS. Since the electric field intensity on the single layer coating surface is almost equal to that of the incident light, the ratio $F(\lambda)$ between the photoelectron emission dose from the multilayer mirror sample and that from the single layer coating sample is equal to the quantity (electric field intensity ratio) showing how many times larger the electric field intensity of the multilayer coating surface is compared to the electric field intensity of the incident light. FIG. 8 shows exemplary measurement results of wavelength dependencies of the reflectance and the electric field intensity ratio.

An alternative way to determine the electric field intensity ratio is to irradiate the EUV light onto the multilayer coating while changing wavelengths, to calculate doses $Q_R$ and $Q_L$ of electrons emitted into the vacuum at two wavelengths, i.e., a wavelength that provides the high reflectance (13.5 nm in the instant embodiment) and a wavelength that provides a lower reflectance (12.5 or 14.5 nm in the instant embodiment), and to use the following equation to compute a parameter showing how many times larger the photoelectron emission dose of the multilayer mirror sample is compared with the single layer coating mirror:

$$F=Q_R/Q_L=I/I_0 \quad (13)$$

Next, the following equation is used to calculate a phase $\delta(\lambda)$:

$$\cos\delta(\lambda)=(F(\lambda)-1-R(\lambda))/(2 \times R^{1/2}(\lambda)) \quad (14)$$

Figure 9:
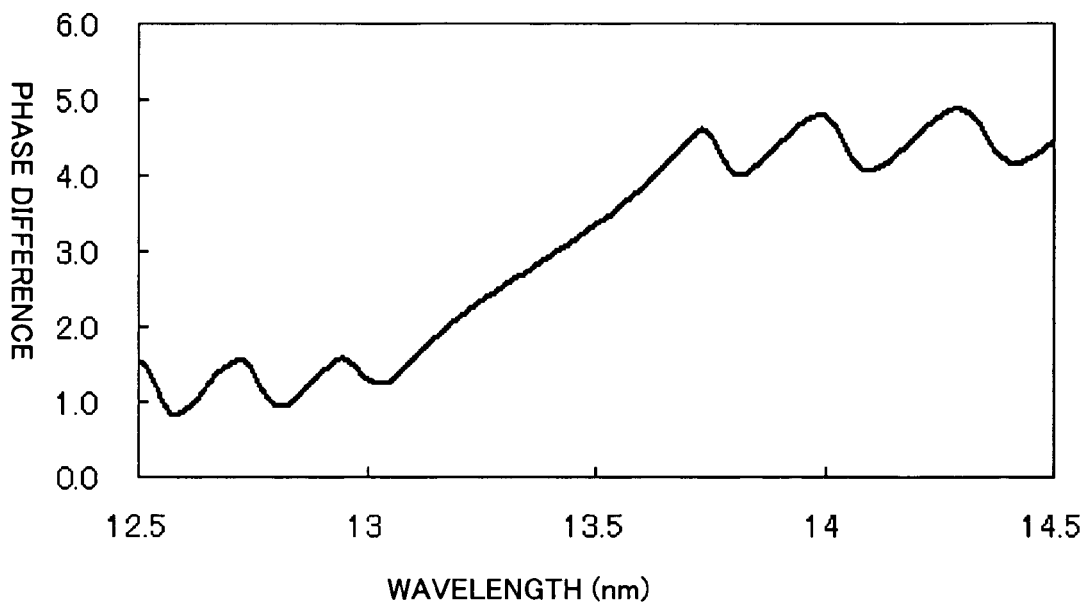
FIG. 9 is a graph showing an exemplary wavelength dependency of a phase difference between incident light and reflected light obtained in the first embodiment.

In calculating the phase difference $\delta$ from a cosine of the phase difference $\delta$, the phase difference $\delta$ should be consecutively connected in a continuously measured region or for the wavelength change, although the phase difference $\delta$ has ambiguities of an integral multiple of $2\pi$. In addition, the wavelength dependency of a phase should have a positive inclination in the wavelength range near the reflection peak of the multilayer coating, although the phase difference $\delta$ has positive and negative ambiguities. FIG. 9 shows the thus obtained wavelength dependency of the phase difference $\delta$ between the incident light and the reflected light.

Next, the surface shape of the multilayer coating sample is measured using the Fizeau interferometer, or Mirau interferometer, etc. and visible light or ultraviolet light. Either one of the surface shape and the phase using the standing wave may be measured first, or both may be measured at the same time.

Next follows a calculation of an equivalent reflective surface shape viewed from the EUV light, i.e., $\delta\lambda/(4\pi\cos\theta)$ and $h+\delta\lambda/(4\pi\cos\theta)$.

Figure 10:
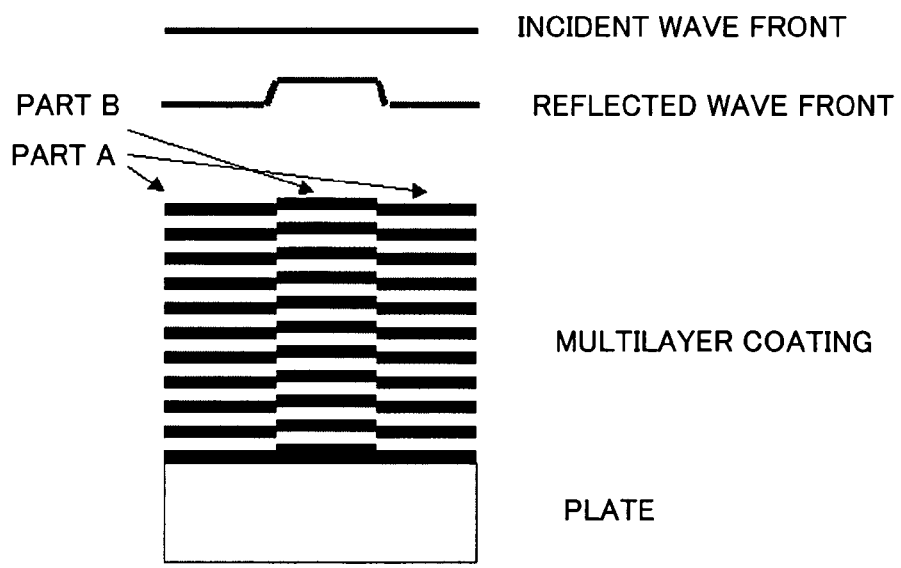
FIG. 10 is a schematic sectional view showing an exemplary multilayer coating structure used for the first embodiment.

FIG. 10 shows an exemplary structure of the multilayer coating. This example includes a difference in the level in the top layer of the multilayer coating; part B is higher than part A. Assume that the coating period is 6 nm, the wavelength of incident light 12 nm, the incident angle 0°, and the difference in the level in the part D is 1.5 nm. Using the visible light, an interferometer measures a shape of the part B to be 1.5 nm higher than the part A. A phase measurement using the above standing wave observes p/2 phase difference between the parts A and B. Therefore, according to the equivalent reflective surface shape viewed from the EUV light, the part B is 1.5 nm higher than the part A. Hence, when a plane wave enters this multilayer coating, it is understood that the wavefront of the reflecting light advances at the part B by 3 nm or a quarter wavelength.

Figure 11:
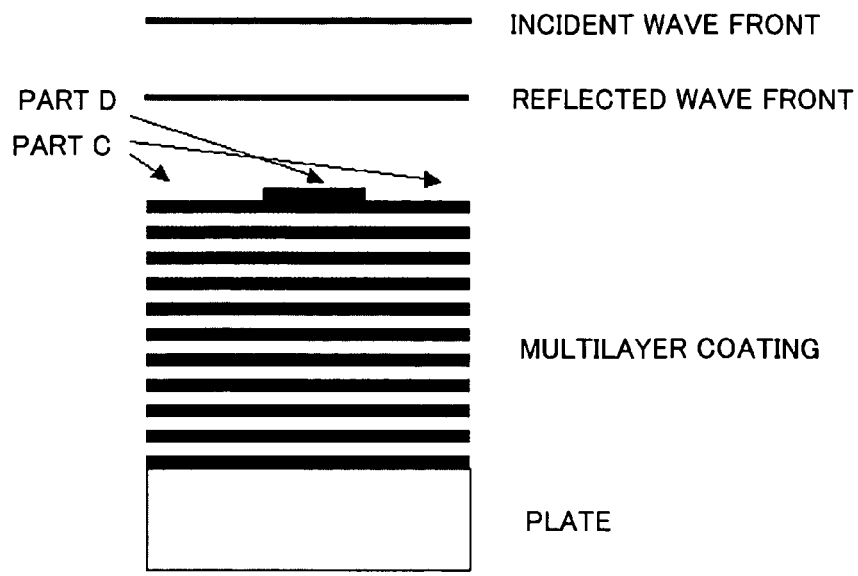
FIG. 11 is a schematic sectional view showing another example of a multilayer coating structure used for the first embodiment.

FIG. 11 shows another exemplary structure of the multilayer coating. This example includes a difference in the level of the multilayer coating's top layer: part D is higher than part C. Assume a coating period is 6 nm, the wavelength of the incident EUV light 12 nm, incident angle 0°, and a difference in level in part D 1.5 nm. Using the visible light, an interferometer measures the part D to be 1.5 nm higher than the part C. A phase measurement using the above standing wave finds a phase difference of $\pi/2$ between the part D and C. Therefore, the equivalent reflective surface shape viewed from the EUV light is a plane cancelled by the surface shape and reflection-induced phase difference. Hence, when a plane wave enters this multilayer coating, it is understood that the wavefront of the reflecting light is a plane.

The instant embodiment can calculate a phase difference between the incident light and the reflected light by using the standing wave produced when the EUV light enters the multilayer coating. It can also calculate the equivalent reflective surface shape viewed from the EUV light or the wavefront of the EUV light reflected on the multilayer coating, based on the measurement result of the multilayer coating surface shape and the phase difference. The phase difference between the incident light and the reflected light can be easily calculated using a measuring apparatus that is merely a common reflectance measuring apparatus to which a photoelectron detector is added. Thus, the measurements with higher precision are available with a smaller apparatus than the conventional interference measurements such as PDI. An incident light monitor corrects the instability of the incident light that results from the instabilities of a light source, monochromator, and the like. Therefore, errors caused by those instabilities are controlled for high-precision measurements. While the instant embodiment addressed to the EUV light, the instant embodiment is applicable to the light of other wavelength ranges, e.g., X-rays, and achieve similar effects.

Second Embodiment

This embodiment uses the measuring apparatus 1 as in the first embodiment, and measures the phase of reflected light as follows: First, the stage 22 retreats the multilayer mirror ML, and the detector 24 measures the intensity of the incident light. At this time, the wavelength dependency of the incident light intensity is measured through the wavelength scanning, i.e., by changing the wavelength λ of the EUV light exiting from the monochromator 12. The incident light's intensity is defined as $I_{R0}(\lambda)$, and an output of the incident light intensity monitor is defined as $I_{00}(\lambda)$. Next, the monochromated EUV light is introduced to a predetermined position on the multilayer mirror ML at a predetermined angle, and the detector measures the intensity of the reflecting light. At the same time, the detector 26 measures the dose of photoelectrons emitted from the surface of the sample ML. At this time, the wavelength dependencies of the reflected light's intensity and the dose of photoelectrons emitted from the surface of the sample ML are measured through the wavelength scanning, i.e., by changing the wavelength settings on the monochromator 12. The light intensity of the light reflected on the multilayer coating sample is defined as $I_{R1}(\lambda)$. The measured photoelectron emission dose from the multilayer coating sample is defined as $Q_s(\lambda)$. The output of incident light intensity monitor at the measurement time is defined as $I_{01}(\lambda)$. The wavelength dependency $R(\lambda)$ of the reflectance of the multilayer mirror ML is given by the above equation 11.

On the other hand, the wavelength dependency $G(\lambda)$ of the photoelectron emission dose of the multilayer mirror sample is given by the following equation:

$$G(\lambda)=Q_s(\lambda)/(I_{01}(\lambda)\times\lambda) \quad (15)$$

Figure 12:
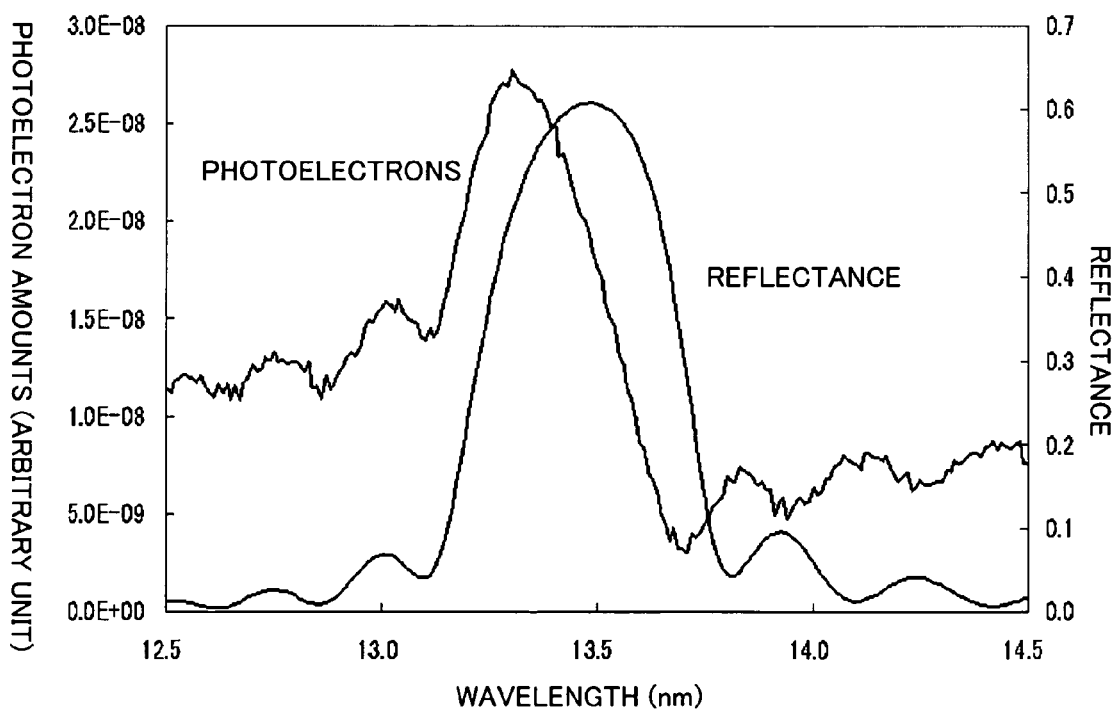
FIG. 12 is a graph showing exemplary measurement results of wavelength dependencies of the reflectance and the photoelectron emission used for a second embodiment.

This is a parameter showing a ratio between the photoelectron emission dose from the multilayer mirror sample and the number of incident photons. Since the photoelectron emission dose per photon is approximately constant in a wave range outside the neighborhood of the absorption edge wavelength of a material that makes of the top layer in the multilayer coating, $G(\lambda)$ is a quantity (the electric field intensity ratio) showing how many times larger the incident light electric field intensity than the electric field intensity of the multilayer coating surface is. FIG. 12 shows exemplary measurement results of wavelength dependencies of the reflectance and the photoelectron emission dose.

Next, the phase $\delta(\lambda)$ is calculated based on the model calculation for the multilayer coating. The reflectance of the multilayer coating and a phase of incident light are calculated after the model calculation. Model calculations are written, for example, in "Layered Synthetic Microstructures as Bragg's Diffractors for X-Rays and Extreme Ultraviolet: Theory and Predicted Performance" Applied Optics 20, 3027 (1981) by J. H. Underwood and T. W. Barbee.

The Fresnel's formula is applied to each interface in the multilayer coating to calculate, for each interface, electric field's complex amplitude relationships of each of the incident wave, transmitted wave, and reflected wave before and after each interface. This relationship provides a recurrence formula, which is used to calculate the electric field's complex amplitude relationships of the incident wave and reflected wave, i.e., complex reflectance on a multilayer coating surface, starting with its substrate side and ending with its top surface. The phase is obtained from an imaginary part of the complex reflectance.

Figure 13:
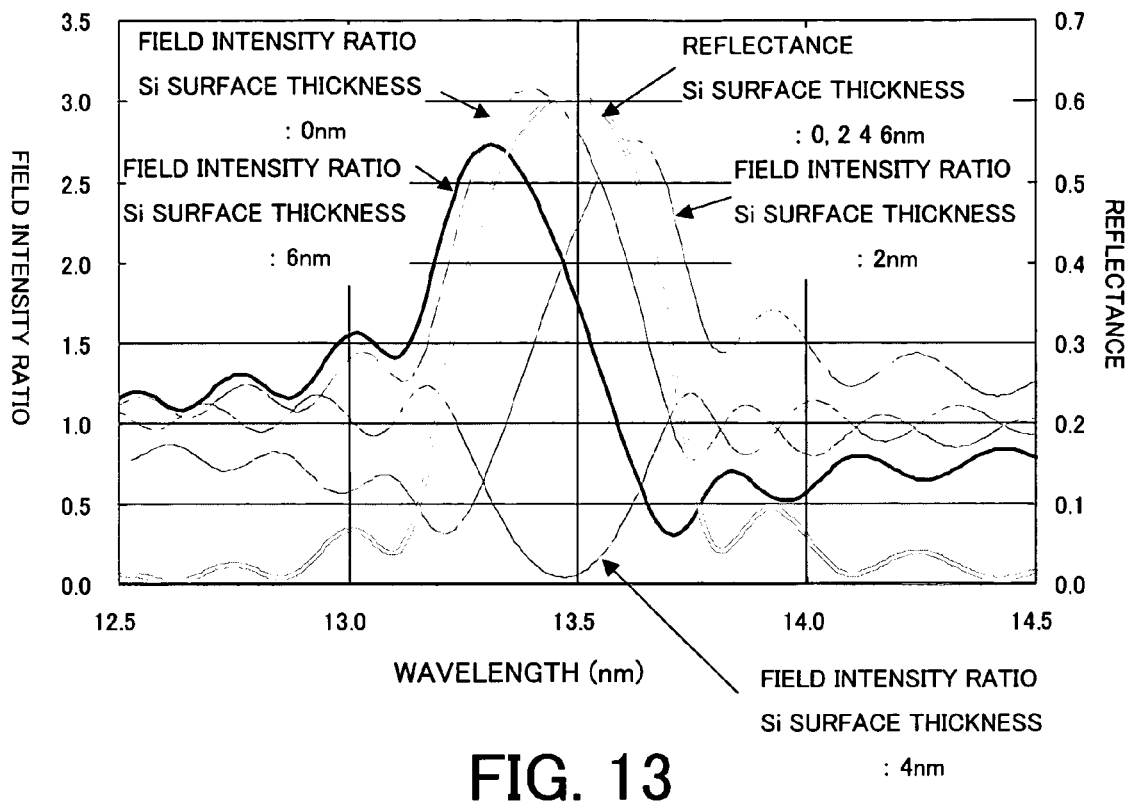
FIG. 13 is a graph showing an exemplary relationship obtained by model calculations among the coating thickness, the wavelength, the electric field intensity ratio, and the reflectance used for the second embodiment.

The electric field intensity of the surface's standing wave is computed from that result. A model to be calculated has a parameter of the silicon's thickness of the top layer of the Mo/Si multilayer coating. FIG. 13 shows exemplary measurement result, which plots the reflectance and the surface's electric field intensity ratio for each of thicknesses of 0, 2, 4, or 6 nm of silicon on the top layer of the Mo/Si multilayer coating. Even if the thickness of silicon on the top layer changes, the reflectance hardly changes. On the other hand, the surface's electric field intensity ratio strikingly changes depending on the thickness of silicon on the top layer.

The fitting changes a coating period of the Mo/Si multilayer coating in a calculation model, i.e., a sum of thicknesses of the molybdenum and silicon, and calculates an optimum coating period that accords a measurement value of the reflectance with a calculated value.

Next, an optimum silicon thickness that accords the electric field intensity ratio with the measured value is calculated by changing the thickness of silicon on the top layer of the calculation model. Due to the ambiguity in absolute value of the electric field intensity ratio, the wavelength dependency are made equal among the electric field intensity ratios. In other words, a constant and the silicon thickness on the top layer are determined so that an observed electric field intensity ratio multiplied by the constant may agree with a calculated value. At this time, an evaluation function is made, for example, of a sum of squares of a difference between an observed electric field intensity ratio multiplied by a constant and a electric field intensity ratio calculated from a model calculation, and the fitting is performed by changing parameters so that a value from this evaluation function may minimize.

Figure 14:
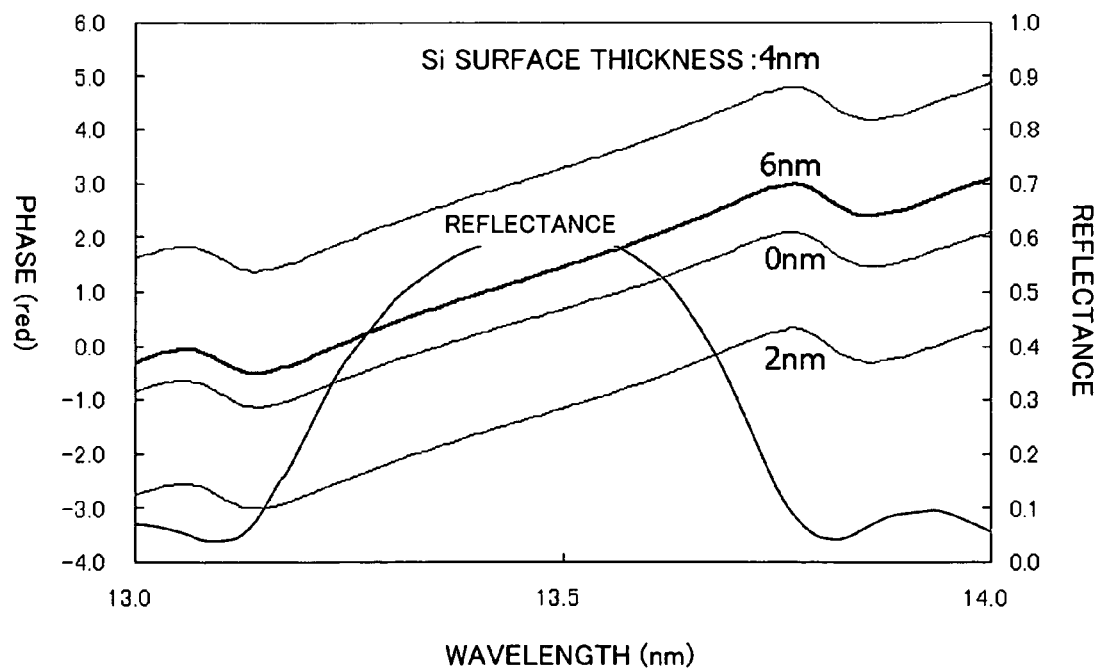
FIG. 14 is a graph showing an exemplary relationship obtained by model calculations among the coating thickness, the wavelength, the phase, and the reflectance used for the second embodiment.

The calculation model is thus determined that best reproduces actually measured values. Next, this determined model is used to calculate the phase of the light reflected on the multilayer coating. This phase is regarded as a measured phase difference between the incident light and the reflected light of the multilayer coating sample ML. In the instant embodiment, a model whose silicon thickness on the topmost layer is 6 nm agrees with the actually measured value. FIG. 14 shows a phase calculated from this model.

This method is applied to each point on the multilayer coating to calculate a phase at each point, and an equivalent reflective surface shape viewed from the EUV light or the reflected light's wavefront when the EUV light enters this multilayer coating, using a multilayer mirror surface shape measurement result to find.

The instant embodiment can calculate a phase difference between the incident light and the reflected light by using the standing wave produced when the EUV light enters the multilayer coating. It can also calculate the equivalent reflective surface shape viewed from the EUV light or the wavefront of the EUV light reflected on the multilayer coating, based on the measurement result of the multilayer coating surface shape and the phase difference. The phase difference between the incident light and the reflected light can be easily calculated using a measuring apparatus that is merely a common reflectance measuring apparatus to which a photoelectron detector is added. Thus, the measurements with higher precision are available with a smaller apparatus than the conventional interference measurements such as PDI. An incident light monitor corrects the instability of the incident light that results from the instabilities of a light source, monochromator, and the like. Therefore, errors caused by those instabilities are controlled for high-precision measurements.

The comparison with a model calculation simplifies the measurement, because it enables a phase difference between incident light and reflected light to be calculated, without measuring the wavelength dependency of the dose of photoelectrons emitted from the surface of the reference sample RS. In measuring the wavelength dependency of the dose of photoelectrons emitted from the surface of the reference sample RS, the comparison with a model calculation may be used to obtain the phase difference between the incident light and reflected light. This method provides an accurate phase difference between the incident light and reflected light.

While the instant embodiment addressed to the EUV light, the instant embodiment is applicable to the light of other wavelength ranges, e.g., X-rays, and achieve similar effects.

Third Embodiment

Figure 15:
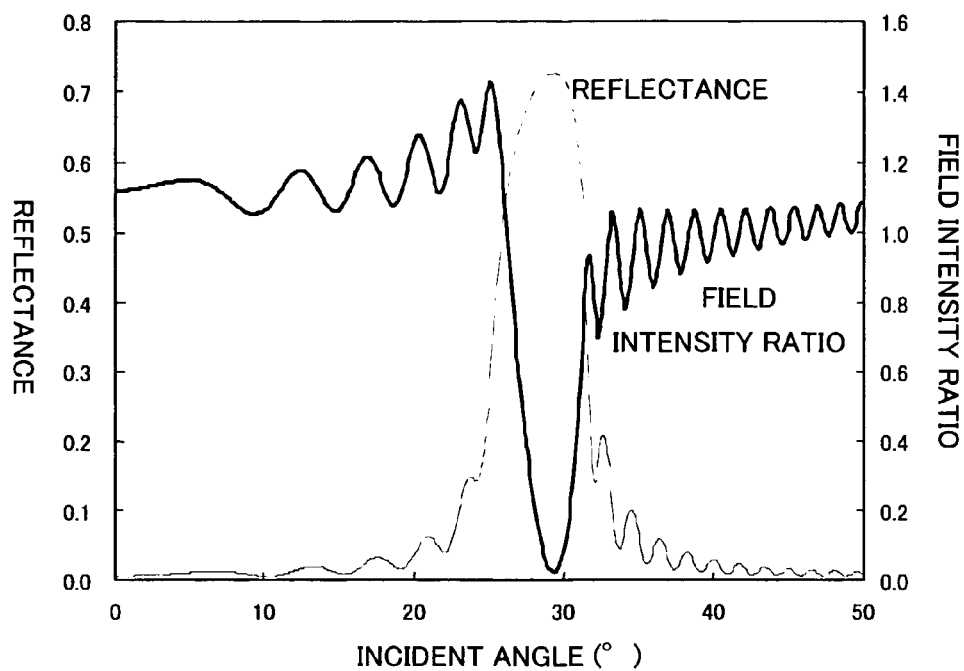
FIG. 15 is a graph showing an exemplary relationship among the incident angle, the reflectance, and the electric field intensity ratio used for a third embodiment.

The instant embodiment irradiates the EUV light onto the multilayer mirror MS, and measures the reflectance of the EUV light and the dose of photoelectrons emitted at the same time. At this time, the incident-angle dependencies of the reflectance and the photoelectron dose are measured by changing the incident angle of the EUV light upon the sample. FIG. 15 shows exemplary measurement results. The thickness of a sum of molybdenum and silicon in the multilayer coating is 8 nm, and the wavelength of the EUV light is 13.5 nm. A phase is calculated from this result by the following equation:

$$\cos\delta(\lambda)=(F(\lambda)1-R(\lambda))/(2\times R^{1/2}(\lambda)) \quad (16)$$

In order to convert the dose of photoelectrons emitted into the electric field intensity, the reference sample RS is used or the emitted photoelectron dose is normalized by the photoelectron emission dose at the incident angle that reduces the reflectance of the sample ML, as in the first embodiment, to obtain the electric field intensity ratio. The normalization of the photoelectron emission dose requires an incident angle near 0° or 50°. An alternative way is to slightly shift the wavelength, and normalize the photoelectron emission dose by that measured at a wavelength that extremely reduces the reflectance of the multilayer coating, because the photoelectron emission dose per photon is almost constant in a wave range outside the neighborhood of the absorption edge wavelength of a material that makes of the top layer of the multilayer coating.

This method is applied to each point on the multilayer coating to calculate a phase at each point, and an equivalent reflective surface shape viewed from the EUV light or the reflected light's wavefront when the EUV light enters this multilayer coating, using a multilayer mirror surface shape measurement result to find.

The instant embodiment can calculate a phase difference between the incident light and the reflected light by using the standing wave produced when the EUV light enters the multilayer coating. It can also calculate the equivalent reflective surface shape viewed from the EUV light or the wavefront of the EUV light reflected on the multilayer coating, based on the measurement result of the multilayer coating surface shape and the phase difference. The phase difference between the incident light and the reflected light can be easily calculated using a measuring apparatus that is merely a common reflectance measuring apparatus to which a photoelectron detector is added. Thus, the measurements with higher precision are available with a smaller apparatus than the conventional interference measurements such as PDI. While the instant embodiment addressed to the EUV light, the instant embodiment is applicable to the light of other wavelength ranges, e.g., X-rays, and achieve similar effects.

Fourth Embodiment

Figure 16:
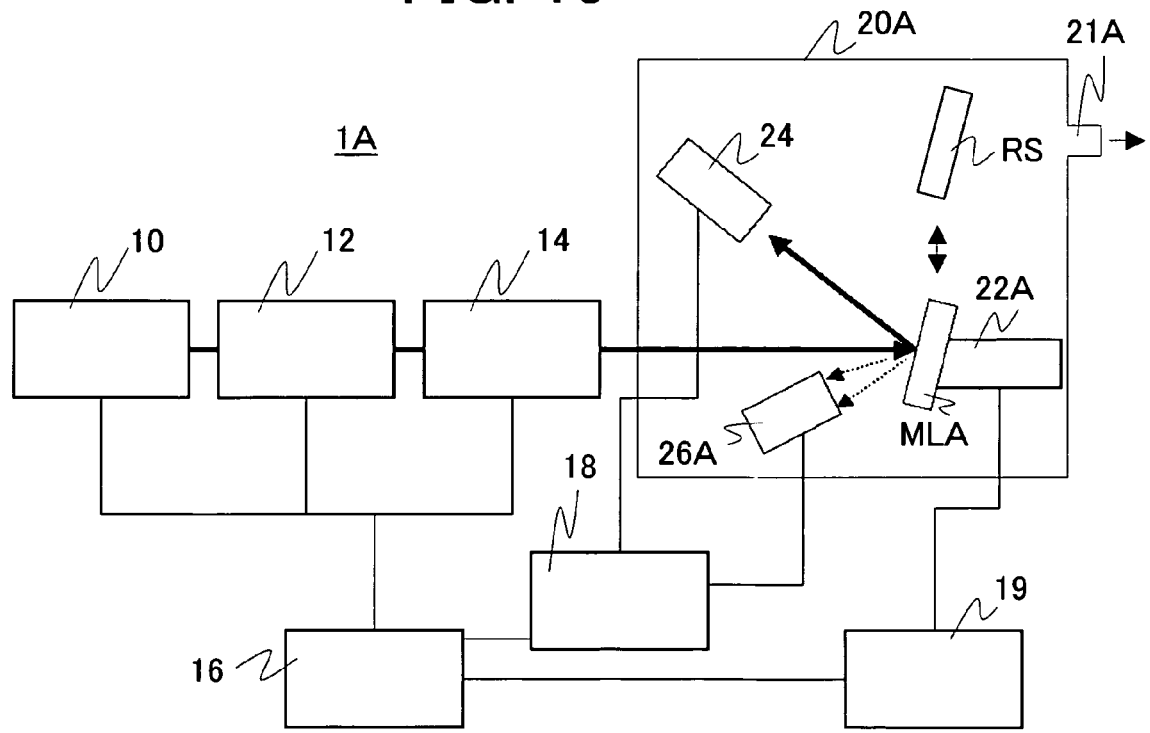
FIG. 16 is a block diagram according to another embodiment of the present invention, which provides a phase change between the incident light upon and reflected light from a multilayer mirror, an equivalent shape change.

Referring now to FIG. 16, a description will be given of an inventive measurement apparatus 1A. Here, FIG. 16 is a schematic block diagram of the measurement apparatus 1A according to the instant embodiment. The instant embodiment uses a similar structure to the measuring apparatus 1 shown in FIG. 1, but the measuring chamber 20A is exhausted by an exhausting means 21 such as a vacuum pump up to the ultra-high vacuum region so as to prevent the air from attenuating the EUV light, from absorbing fluorescent X-rays or from contaminating adhering to the multilayer coating surface. A detector 26A is located near the multilayer mirror ML to detect the fluorescent X-rays. The detector 26a can use a semiconductor X-ray detector (SSD), a cooling CCD, a micro-calorie meter, and the like. Preferably, this detector can discriminate the photon energy from the fluorescent X-rays, or measure the spectra of fluorescent X-rays or specific X intensity in a specific energy range.

The top surface of the multilayer coating sample includes a layer made of a specific material different from that makes of the lower layers of the multilayer coating. For example, the surface of a Mo/Si multilayer coating is provided with a layer of several nanometers of ruthenium. The X-ray detector has such a detectable energy range that it may detect only characteristic X-rays peculiar to the element that makes of the top layer.

Usually, the top layer of the multilayer mirror is provided with a thin film made of ruthenium or carbon as a cap layer for preventing the multilayer oxidation or contamination adhering. Thus, the detectable energy range may be set up so as to detect only characteristic X-rays peculiar to the element that makes of this layer.

The instant embodiment uses the same steps as those in the first embodiment to measure the phase of the reflected light. While the first embodiment measures the dose of photoelectrons emitted from the sample surface, the instant embodiment measures the dose of fluorescent X-rays emitted from the surface of the sample in order to calculate the phase. Since the X-ray detector of the instant embodiment has a detectable energy range so as to detect only the characteristic X-rays peculiar to the element that makes of the top layer in the multilayer coating, the detected intensity of fluorescent X-rays is proportionate to the electric field intensity of the multilayer top surface.

The instant embodiment can calculate a phase difference between the incident light and the reflected light by using the standing wave produced when the EUV light enters the multilayer coating. It can also calculate the equivalent reflective surface shape viewed from the EUV light or the wavefront of the EUV light reflected on the multilayer coating, based on the measurement result of the multilayer coating surface shape and the phase difference. The phase difference between the incident light and the reflected light can be easily calculated using a measuring apparatus that is merely a common reflectance measuring apparatus to which a photoelectron detector is added. Thus, the measurements with higher precision are available with a smaller apparatus than the conventional interference measurements such as PDI. An incident light monitor corrects the instability of the incident light that results from the instabilities of a light source, monochromator, and the like. Therefore, errors caused by those instabilities are controlled for high-precision measurements. While the instant embodiment addressed to the EUV light, the instant embodiment is applicable to the light of other wavelength ranges, e.g., X-rays, and achieve similar effects.

Fifth Embodiment

Figure 5:
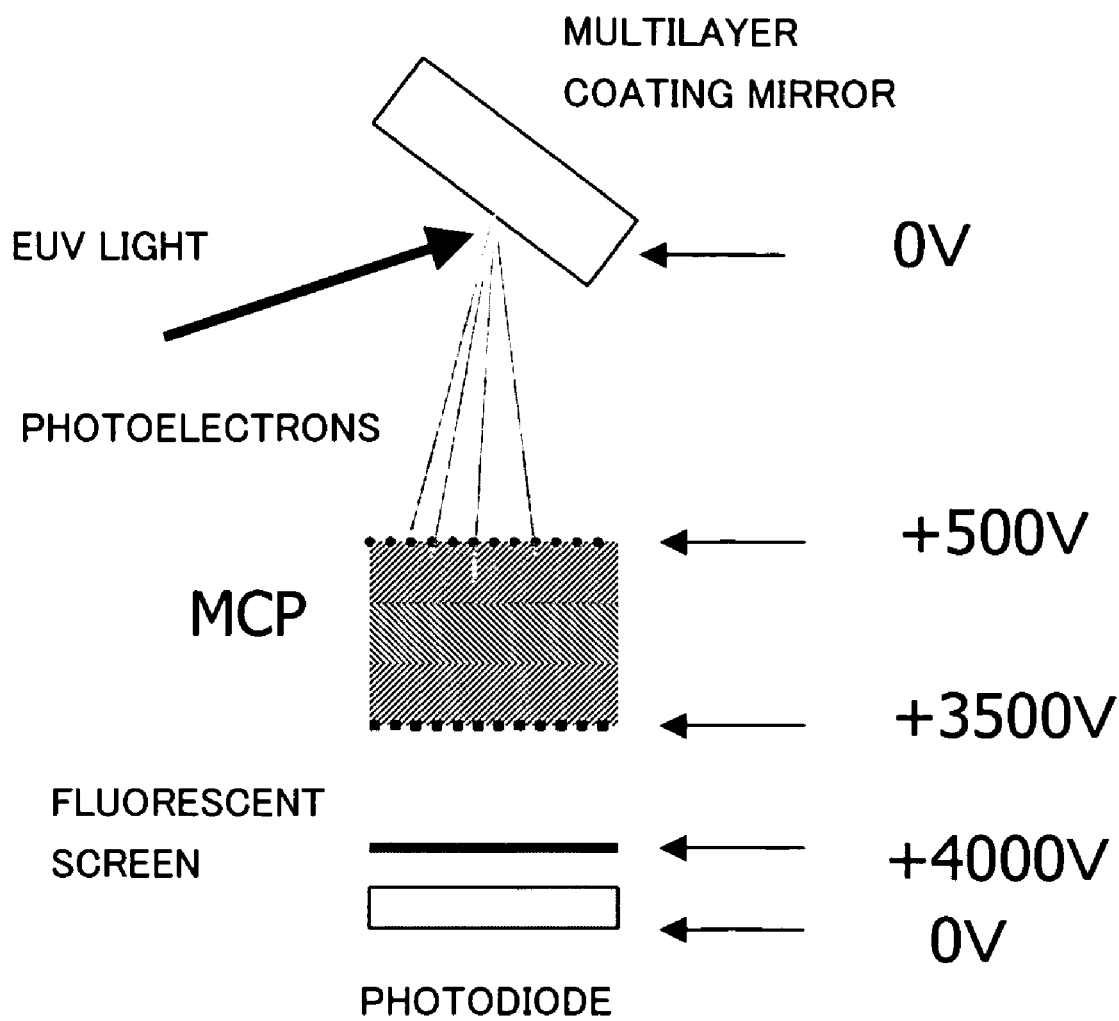
FIG. 5 graphically shows a measurement of a electric field intensity ratio of a multilayer coating surface used in the instant embodiment.

The instant embodiment uses a measuring apparatus 1A similar to that of the fourth embodiment. The instant embodiment detects photoelectrons emitted from the multilayer coating's surface. As shown in FIG. 5, a micro-channel plate is used for a photoelectron detector. Here, FIG. 5 graphically shows a measurement of the electric field intensity of the multilayer coating's surface. When the EUV light enters the multilayer coating sample, photoelectrons emitted by the photoelectric effect enter the MCP. In order to efficiently collect photoelectrons, the voltage is applied such that the incident plane of MCP has a potential of about +100 to +500 V relative to the multilayer coating.

A strong potential difference of about 2000 to about 6000 volts is provided to the inside of MCP to accelerate electrons. Therefore, incident electrons are amplified from 106 to 108, and emitted from the exit plane. These electrons collide into a fluorescent screen held in a further positive potential to the MCP exit plane, and produce visible fluorescence. This fluorescence is detected by a photodetector, such as a photodiode and photoelectron multiplier tube. The MCP exit plane is maintained in a positive high voltage to accelerate electrons. The fluorescent screen is maintained in a further positive voltage such as about +3000 to +8000 V relative to the multilayer coating in order to attract electrons. Since the fluorescent plane converts the visible light, the photodetector can be set to have an arbitrary electric potential. For example, the photodetector is maintained at a potential as high as that of the multilayer coating.

When the amplified electrons are detected as they are, an output of the detector will be in a positive high voltage. Therefore, a condenser is used to remove the DC component, and only time-varying AC component is input to a signal processing system. This method is effective in a time-varying pulse light source, such as laser plasma and discharge plasma. However, this method that shields the DC constituents by the condenser is not applicable to a light source that generates time-continuous light, such as synchrotron radiation (SR). On the other hand, the above configuration that irradiates electrons output from the above MCP to a phosphor and detects the generated fluorescence through a photodetector can maintain the potential of the photodetector as high as that of the multilayer coating, and advantageously inputs its output to the signal processing system.

The instant embodiment uses the measuring apparatus 1A, and the same steps as the second embodiment to measure the phase of the reflected light. Therefore, a detailed description thereof will be omitted.

The instant embodiment can calculate a phase difference between the incident light and the reflected light by using the standing wave produced when the EUV light enters the multilayer coating. It can also calculate the equivalent reflective surface shape viewed from the EUV light or the wavefront of the EUV light reflected on the multilayer coating, based on the measurement result of the multilayer coating surface shape and the phase difference. The phase difference between the incident light and the reflected light can be easily calculated using a measuring apparatus that is merely a common reflectance measuring apparatus to which a photoelectron detector is added. Thus, the measurements with higher precision are available with a smaller apparatus than the conventional interference measurements such as PDI. An incident light monitor corrects the instability of the incident light that results from the instabilities of a light source, monochromator, and the like. Therefore, errors caused by those instabilities are controlled for high-precision measurements.

The comparison with a model calculation simplifies the measurement, because it enables a phase difference between incident light and reflected light to be calculated, without measuring the wavelength dependency of the dose of photoelectrons emitted from the surface of the reference sample RS. In measuring the wavelength dependency of the dose of photoelectrons emitted from the surface of the reference sample RS, the comparison with a model calculation may be used to obtain the phase difference between the incident light and reflected light. This method provides an accurate phase difference between the incident light and reflected light.

While the instant embodiment addressed to the EUV light, the instant embodiment is applicable to the light of other wavelength ranges, e.g., X-rays, and achieve similar effects.

Sixth Embodiment

By the similar steps to those of the third embodiment, the instant embodiment irradiates the EUV light to a multilayer mirror MS, and measures the reflectance of the EUV light and a dose of the fluorescent X-rays simultaneously. While the third embodiment measures the dose of photoelectrons emitted from the surface of a sample, the instant embodiment measures the dose of fluorescent X-rays emitted from the surface of the sample, and calculates the phase.

The instant embodiment can calculate a phase difference between the incident light and the reflected light by using the standing wave produced when the EUV light enters the multilayer coating. It can also calculate the equivalent reflective surface shape viewed from the EUV light or the wavefront of the EUV light reflected on the multilayer coating, based on the measurement result of the multilayer coating surface shape and the phase difference. The phase difference between the incident light and the reflected light can be easily calculated using a measuring apparatus that is merely a common reflectance measuring apparatus to which a photoelectron detector is added. Thus, the measurements with higher precision are available with a smaller apparatus than the conventional interference measurements such as PDI. An incident light monitor corrects the instability of the incident light that results from the instabilities of a light source, monochromator, and the like. Therefore, errors caused by those instabilities are controlled for high-precision measurements.

Seventh Embodiment

This embodiment uses the measuring apparatus 1A used in the fourth embodiment, but the top surface of a multilayer coating sample is coated with a resist.

Figure 17:
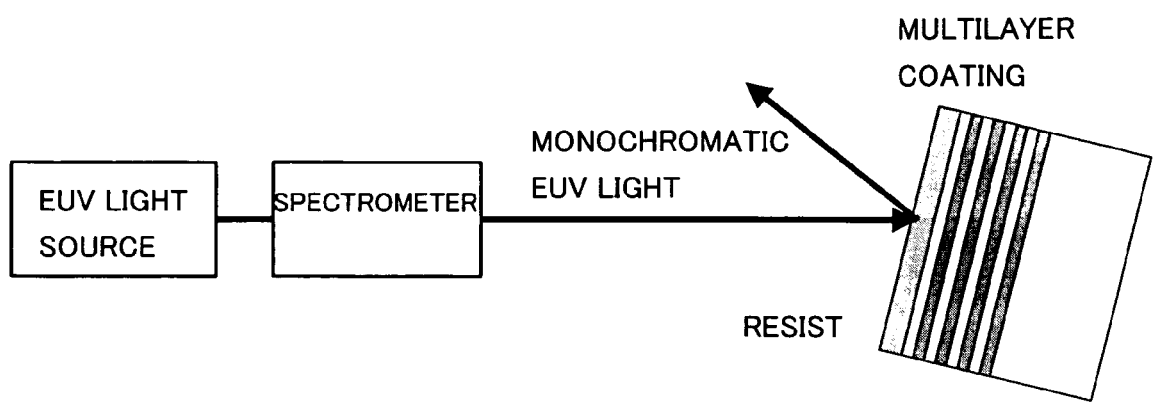
FIG. 17 is a block diagram according to one embodiment of the present invention, which provides a phase change between the incident light upon and reflected light from a multilayer mirror, an equivalent shape change.

Referring to FIG. 17, a description will be given of a phase of the reflected light according to the instant embodiment. Here, FIG. 17 is a block diagram for calculating transmitting shape changes by phases and phase changes between incident light and reflected light on a multilayer mirror MLA. The instant embodiment uses the following steps to measure the phase of the reflected light. The stage 22A is set so that the monochromated EUV beam enters a predetermined position at a predetermined angle on the multilayer mirror MLA. The EUV light is irradiated for a certain time period. Next, the multilayer coating sample is taken out of the measuring chamber, and the resist is developed. Next, the residual coating distribution of the resist is measured. Since the residual coating of the resist depends upon the electric field intensity of the multilayer coating surface, the electric field intensity distribution of the multilayer mirror surface can be calculated from the residual coating distribution of the resist. If the phase difference between the incident light and reflected light of the multilayer coating is constant at every location and the reflectance is also constant, the residual coating of the resist is constant. On the contrary, if the reflectance is almost constant, the residual coating distribution of the resist shows a distribution of a phase difference between the incident light and the reflected light of the multilayer coating.

Next, the reflectance distribution of the multilayer coating is measured by the similar steps to those of the fourth embodiment. A phase difference between the reflected light and the incident light of the multilayer coating is calculated based on a formula and the electric field intensity distribution calculated from the residual coating distribution of the resist, and the EUV reflectance distribution.

The instant embodiment can calculate a phase difference between the incident light and the reflected light by exposing the resist applied on the multilayer coating surface, measuring the residue after the development, and utilizing the standing wave produced when the EUV light enters the multilayer coating. It can also calculate the equivalent reflective surface shape viewed from the EUV light or the wavefront of the EUV light reflected on the multilayer coating, based on the measurement result of the multilayer coating surface shape and the phase difference. The phase difference between the incident light and the reflected light can be easily calculated using a measuring apparatus that is merely a common reflectance measuring apparatus to which a photoelectron detector is added. Thus, the measurements with higher precision are available with a smaller apparatus than the conventional interference measurements such as PDI. While the instant embodiment addressed to the EUV light, the instant embodiment is applicable to the light of other wavelength ranges, e.g., X-rays, and achieve similar effects.

Preferably, the phase difference between the incident light and reflected light is the same at every location on the multilayer mirror for an imaging optical system on actually used conditions in terms of a wavelength and incident angle of the EUV light entering every point on the mirror. Therefore, the resist is exposed equally and the post-development residual coating becomes uniform when the EUV light is irradiated onto the multilayer mirror for the imaging optical system, onto which the resist is applied, on the actually use conditions that approximately equalize the wavelength and incident angle of the EUV light incident on various points in the mirror. Should there be uneven residual coating, the phase disturbs at that portion on the multilayer coating. In other words, an irregularity of a phase of the reflected light within the mirror plane can be evaluated by irradiating the EUV light onto the resist-applied multilayer mirror, used for the imaging optical system and by exposing the resist, when the condition is almost equal to the actual use condition of the imaging optical system with respect to the wavelength and incident angle of the EUV light entering each point in the mirror. An evaluation of a wide area at one time provides a high productivity.

Eighth Embodiment

Figure 2:
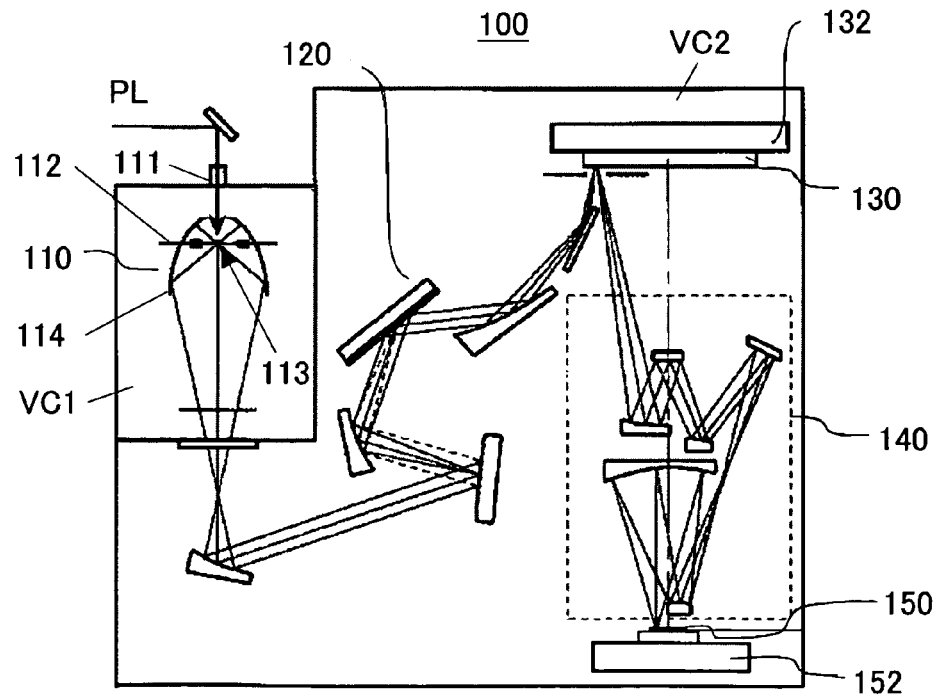
FIG. 2 is a schematic sectional view of an EUV exposure apparatus of the instant embodiment.

A description will now be given below of an inventive EUV exposure apparatus 100. FIG. 2 is a schematic sectional view of the EUV exposure apparatus. The EUV exposure apparatus 100 is an exposure apparatus that uses the EUV light (e.g., with a wavelength of 13.5 nm) as exposure light for exposure. Referring to FIG. 2, the exposure apparatus 100 includes an EUV light source section 110, an illumination optical system 120, a reflection reticle (mask) 130, a reticle stage 132, a projection optical system 140, a wafer 150, and a wafer stage 152, and houses the illumination optical system 120 to the wafer stage 152 in a vacuum chamber VC2.

The EUV light source section 110 uses a target supply system 112 arranged in the vacuum chamber VC1 to irradiate a highly intensive pulse laser beam PL from a laser light source (not shown) to a target supplied at a condensing position 113 via a condensing optical system (not shown), generate high temperature plasma, and utilize the EUV light with a wavelength of 13.5 nm radiating from this. More specifically, the EUV light source section 110 irradiates a high-intensity excitation pulse laser to the target to excite the target into a high-temperature plasma state, and from light of a waveband of infrared to ultraviolet and the EUV light isotropically emitted when the plasma cools down, a condenser mirror 114 condenses the EUV light, and uses it as exposure light.

The pulse laser beam PL is, for example, an Nd:YAG laser, excimer laser, and the like. The vacuum chamber VC1 maintains a vacuum atmospheric environment for the EUV light having a small transmittance to the air. The pulse laser beam PL is condensed at the condensing position 113 via a window 111 on the vacuum chamber VC1. The target includes, depending on EUV light wavelength to be generated, metal thin films such as Cu, Li, Zn, etc., inert gases such as Xe, droplet, etc., and is supplied to the vacuum container VC1 by a target supply system 112 such as a gas jet. Since not whole target supplied contributes to the plasma production, the target supply system 112 has a target recovery system that recovers remaining target.

The EUV light introduced into the vacuum chamber VC2 illuminates the mask 130 having a predetermined pattern via the illumination optical system 120. The illumination optical system 120 serves to propagate the EUV light and illuminate the mask 130, and includes a plurality of mirrors, an optical integrator, and an aperture. The optical integrator serves to illuminate the reticle 130 uniformly with a predetermined NA. The aperture is provided at a position conjugate with the reticle 130, and limits the illuminated area on the reticle 130 surface to an arc shape.

The EUV light that is selectively reflected by the reflection mask 130 is projected onto the wafer 150 coated with a resist by the projection optical system 140 that includes plural mirrors, thus transferring the pattern on the mask 130 onto the wafer 150.

Since an illuminated area of the mask 130 and a projected image on the wafer 150 is limited to a very narrow arc range of the same image point for good imaging with reduced aberrations of the projection optical system 140, the exposure apparatus 100 executes a so-called scan exposure that synchronously scans the reticle stage 132 and the wafer stage 152 in exposing all of the pattern formed on the mask 130 onto the wafer 150.

Scores of pairs of multilayer coatings having Mo, Si, etc. are formed on the substrate for effective reflections of the EUV light by the condenser mirror 112, the illumination optical system 120, the reflection reticle 130, and the projection optical system 140. The surface roughness should be an order of 0.1 nm by standard deviation for controlled reflectance. The projection optical system 140 is required to be an extremely precise optical system: Its mirrors are required to have the shape precision of an order of 0.1 nm by standard deviation, in addition to the above surface roughness. The inventive evaluation method is applied to these reflective optical elements to form the multilayer coating having a high-precision surface shape viewed from the EUV light. The wavefront aberration of the projection optical system 140 is appropriately adjusted by applying the evaluation method of the instant embodiment.

Ninth Embodiment

Figure 18:
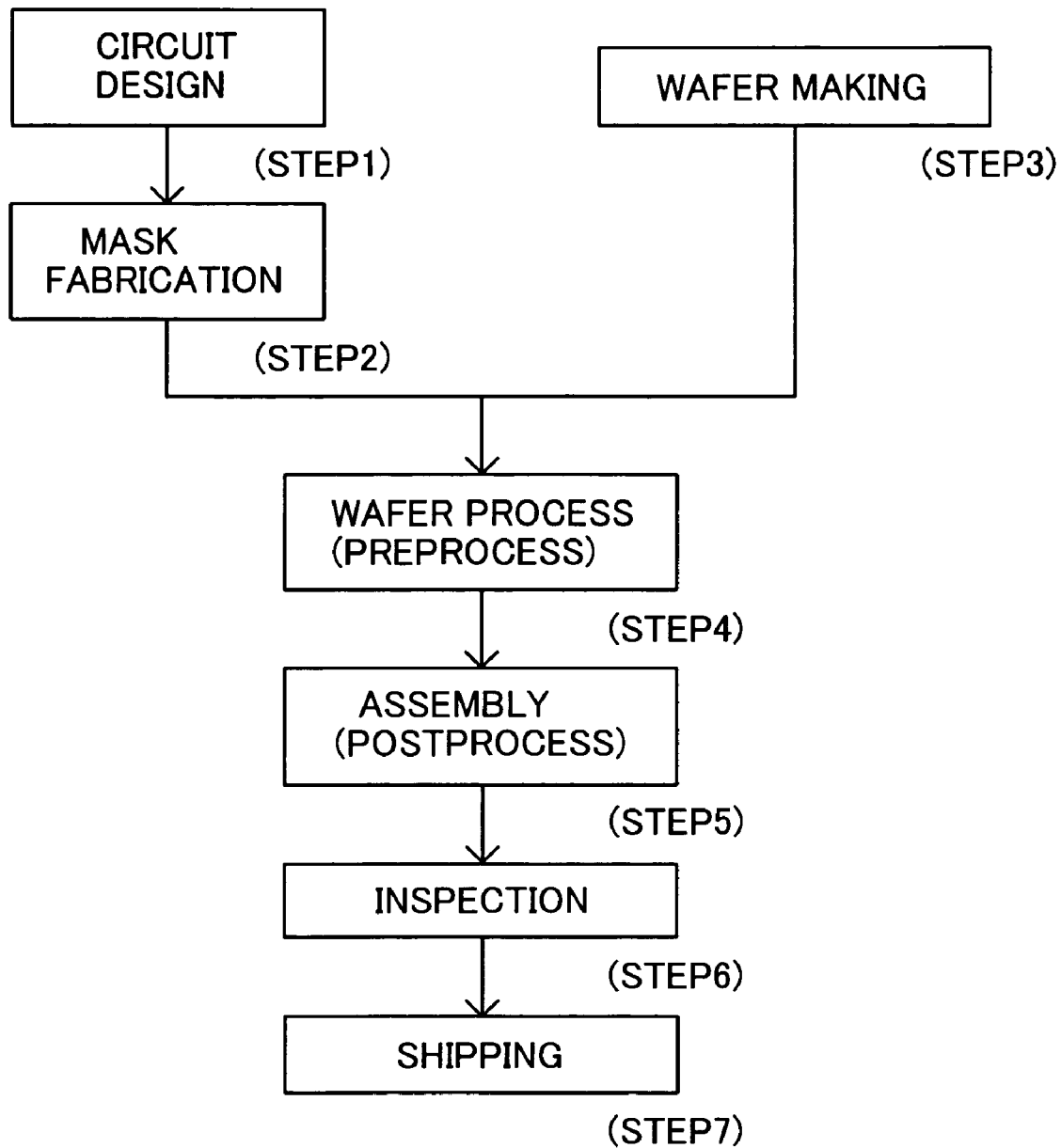
FIG. 18 is a flowchart for explaining manufacturing of devices (such as semiconductor chips like ICs, LSIs, and others, LCDs, CCDs, and the like).
Figure 19:
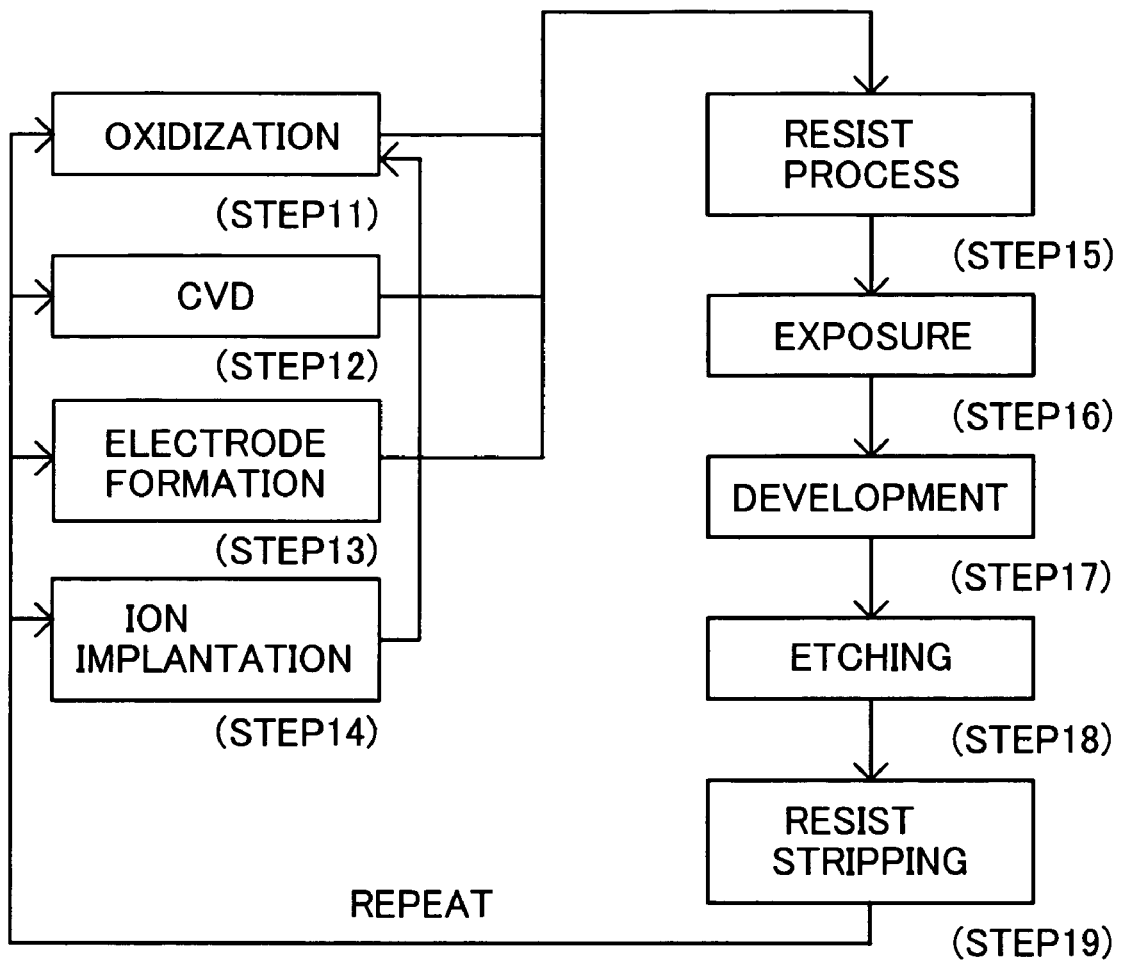
FIG. 19 is a detailed flowchart for the wafer process of Step 4 shown in FIG. 18.

Referring to FIGS. 18 and 19, a description will now be given of an embodiment of a device fabrication method using the above exposure apparatus. FIG. 18 is a flowchart for explaining how to fabricate devices (i.e., semiconductor chips such as IC and LSI, LCDs, CCDs and the like). Here, a description will be given of the fabrication of a semiconductor chip as an example. Step 1 (circuit design) designs a device. Step 2 (mask fabrication) forms a mask having a designed circuit pattern. Step 3 (wafer making) manufactures a wafer using materials such as silicon. Step 4 (wafer process), which is also referred to as a pretreatment, forms actual circuitry on the wafer through photolithography using the mask and wafer. Step 5 (assembly), which is also referred to as a posttreatment, forms into a semiconductor chip the wafer formed in Step 4 and includes an assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

FIG. 19 is a detailed flowchart of the wafer process in Step 4 shown in FIG. 18. Step 11 (oxidation) oxidizes the wafer's surface. Step 12 (CVD) forms an insulating film on the wafer's surface. Step 13 (electrode formation) forms electrodes on the wafer by vapor disposition and the like. Step 14 (ion implantation) implants ions into the wafer. Step 15 (resist process) applies a photosensitive material onto the wafer. Step 16 (exposure) uses the above exposure apparatus to expose a circuit pattern on the mask onto the wafer. Step 17 (development) develops the exposed wafer. Step 18 (etching) etches parts other than a developed resist image. Step 19 (resist stripping) removes unused resist after etching. These steps are repeated, and multiple circuit patterns are formed on the wafer. According to the device fabrication method of the instant embodiment, an optical system whose wavefront aberration is appropriately adjusted is used to fabricate a high-quality device having a desired resolution. Thus, the device fabrication method using such an exposure apparatus as well as its resulting devices function as an aspect of the present invention.

Further, the present invention is not limited to these preferred embodiments, and a various variations and modifications may be made without departing from the spirit and scope of the present invention.

Thus, the inventive optical-element evaluation method and apparatus can easily and inexpensively measure a relationship between a wavefront of the incident light and a wavefront of the reflected light with respect to one optical element.

This application claims priority from Japanese Patent Applications Nos. 2003-314842, filed on Sep. 5, 2003, and 2004-053730, filed on Feb. 27, 2004 each of which is hereby incorporated by reference herein.

What is claimed is:

1. An evaluation method for a reflective optical element on which a multilayer coating is formed, said method comprising the steps of:
   measuring a secondary radiation emitted from the multilayer coating when light with a wavelength of 2 to 40 nm is introduced into the optical element;
   calculating a phase difference between the light incident on the multilayer coating and light reflected from the multilayer coating, based on a result of said measuring the secondary radiation emitted from the multilayer; and
   evaluating an equivalent surface shape of the multilayer coating based on a result of said calculating step.

2. The evaluation method according to claim 1, further comprising the steps of:
   measuring a surface shape of the optical element; and
   determining a wavefront of the light reflected by the optical element based on values obtained in said measuring and calculating steps.

3. The evaluation method according to claim 1, wherein said calculating step includes measuring an incident-angle dependency of the light incident upon the optical element with respect to the secondary radiation emitted from the multilayer coating.

4. The evaluation method according to claim 1, wherein said calculating step determines a wavelength dependency of the light incident upon the optical element with respect to the secondary radiation emitted from the multilayer coating.

5. The evaluation method according to claim 1, wherein said calculating step includes introducing the light into the multilayer coating at an angle different from an incident angle that satisfies Bragg's condition of the multilayer coating, and of measuring the secondary radiation emitted from the multilayer coating.

6. The evaluation method according to claim 1, wherein said calculating step includes introducing the light into the multilayer coating with a wavelength different from a wavelength that satisfies Bragg's condition of the multilayer coating, and of measuring the secondary radiation emitted from the multilayer coating.

7. The evaluation method according to claim 1, wherein said calculating step includes introducing the light into a reference sample, and of measuring a secondary radiation emitted from a surface of the reference sample made of the same material as a top layer of the multilayer coating.

8. The evaluation method according to claim 1, wherein said calculating step includes fitting an actual measurement value by a model calculation with respect to a reflectance of the multilayer coating and a phase of the reflecting light.

9. The evaluation method according to claim 1, wherein said calculating step includes accelerating and/or amplifying photoelectrons emitted from the multilayer coating, of irradiating the photoelectrons to a fluorescent material, and of measuring light emitted from the fluorescent material.

10. The evaluation method according to claim 1, wherein a top layer of the multilayer coating is made of a material different from a layer other than the top layer.

11. An evaluation method for a reflective optical element on which a multilayer coating is formed, said method comprising the steps of:
   applying a resist onto a surface of the multilayer coating;
   introducing light with a wavelength of 2 to 40 nm into the multilayer coating to which the resist is applied, and exposing the resist;
   measuring a residual coating distribution of the exposed resist;
   calculating a phase difference between the light incident on the multilayer coating and light reflected from the multilayer coating, based on a result of said measuring the residual coating distribution of the exposed resist; and
   evaluating an equivalent surface shape of the multilayer coating based on a result of said calculating step.

12. An evaluation apparatus of a reflective optical element on which a multilayer coating is formed, said evaluation apparatus comprising:
   an illumination optical system for introducing light with a wavelength of 2 to 40 ran into the multilayer coating;
   a detector for detecting a secondary radiation emitted from the multilayer coating; and a calculator for calculating a phase difference between the light incident on the multilayer coating and light reflected from the multilayer coating, based on a detection result of said detector for detecting a secondary radiation emitted from the multilayer coating.

13. An evaluation method for a reflective optical element on which a multilayer coating is formed, said method comprising the steps of:

measuring a secondary radiation consisting of fluorescent X-ray or photoelectrons emitted from the multilayer coating when light with a wavelength of 2 to 40 nm is introduced into the optical element;

calculating a phase difference between the light incident on the multilayer coating and light reflected from the multilayer coating, based on a result of said measuring the secondary radiation consisting of fluorescent X-ray or photoelectrons emitted from the multilayer; and evaluating an equivalent surface shape of the multilayer coating based on a result of said calculating step.

* * * * *

UNITED STATES PATENT AND TRADEMARK OFFICE
CERTIFICATE OF CORRECTION

| | | |
|---|---|---|
| PATENT NO. | : 7,453,560 B2 | Page 1 of 1 |
| APPLICATION NO. | : 10/933570 | |
| DATED | : November 18, 2008 | |
| INVENTOR(S) | : Akira Miyake | |

It is certified that error appears in the above-identified patent and that said Letters Patent is hereby corrected as shown below:

Column 5, line 45, "shape error a" should read --shape error $\sigma$--.
Column 6, line 13, "heaves by a" should read --heaves by h--.
Column 6, line 46, "h+$\delta\lambda$/(4$\lambda$cos$\theta$)" should read --h+$\delta\lambda$/(4$\pi$cos$\theta$)--.
Column 8, line 43, "700°" should read --70°--.
Column 9, line 23, "$\delta$0" should read --$\theta$0--.

Column 24, claim 12, line 65, "2 to 40 ran" should read --2 to 40 nm--.
Column 25, claim 13, line 10, "X-ray" should read --X-rays--.

Signed and Sealed this

Third Day of February, 2009

JOHN DOLL
*Acting Director of the United States Patent and Trademark Office*